(12) United States Patent
Dixon et al.

(10) Patent No.: US 11,874,311 B1
(45) Date of Patent: Jan. 16, 2024

(54) DETECTING RADIO FREQUENCY ELECTROMAGNETIC RADIATION USING VAPOR CELL SENSORS AND COMB SPECTRA

(71) Applicant: Quantum Valley Ideas Laboratories, Waterloo (CA)

(72) Inventors: Katelyn Dixon, Kitchener (CA); Kent Arnold Nickerson, Waterloo (CA); Donald Booth, Kitchener (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 18/296,307

(22) Filed: Apr. 5, 2023

Related U.S. Application Data

(60) Provisional application No. 63/392,404, filed on Jul. 26, 2022.

(51) Int. Cl.
*G01R 29/08* (2006.01)
*G01R 35/00* (2006.01)

(52) U.S. Cl.
CPC ..... *G01R 29/0885* (2013.01); *G01R 29/0892* (2013.01); *G01R 35/005* (2013.01)

(58) Field of Classification Search
CPC . G01R 29/0885; G01R 29/089; G01R 35/005
USPC .......................................................... 324/96
See application file for complete search history.

(56) References Cited

U.S. PATENT DOCUMENTS

| | | | |
|---|---|---|---|
| 4,918,491 A | * | 4/1990 | Sonobe ............... G01J 9/04 356/451 |
| 10,509,065 B1 | | 12/2019 | Shaffer |
| 10,564,201 B1 | | 2/2020 | Shaffer |
| 10,802,066 B1 | * | 10/2020 | Keaveney ......... G01R 29/0885 |
| 11,137,487 B1 | | 10/2021 | Amarloo et al. |

(Continued)

FOREIGN PATENT DOCUMENTS

| CA | 3120473 | 7/2020 |
|---|---|---|
| IN | 452021 | 11/2021 |

OTHER PUBLICATIONS

Zhang, Li-Hua, et al. "Rydberg microwave-frequency-comb spectrometer." Physical Review Applied 18.1 (2022): 014033. (Year: 2022).*

(Continued)

*Primary Examiner* — Christopher P McAndrew
(74) *Attorney, Agent, or Firm* — Henry Patent Law Firm PLLC

(57) ABSTRACT

In a general aspect, radio frequency (RF) electromagnetic radiation can be detected using vapor cell sensors. In some aspects, a system includes a laser system that is configured to generate laser signals that comprise first and second laser signals. The system also includes an optical comb generator and a vapor cell sensor. The optical comb generator is configured to generate a comb spectrum based on the first laser signal. The comb spectrum includes comb lines at respective comb frequencies. The vapor cell sensor contains a vapor and is configured to generate an optical spectrum based on interactions of the vapor with the comb spectrum and the second laser signal. The system also includes an optical detector that is configured to detect the property of the optical spectrum at one or more of the comb frequencies.

30 Claims, 15 Drawing Sheets

(56) References Cited

U.S. PATENT DOCUMENTS

| | | |
|---|---|---|
| 11,209,473 B2 | 12/2021 | Amarloo et al. |
| 2016/0363617 A1 | 12/2016 | Anderson et al. |
| 2019/0181611 A1* | 6/2019 | Maleki .............. H01S 3/094076 |
| 2022/0228972 A1 | 7/2022 | Nelson et al. |

OTHER PUBLICATIONS

Okoshi, Takanori, Kazuro Kikuchi, and Akira Nakayama. "Novel method for high resolution measurement of laser output spectrum." Electronics letters 16.16 (1980): 630-631. (Year: 1980).*

Anderson, et al., "Continuous-frequency measurements of high-intensity microwave electric fields with atomic vapor cells", Appl. Phys. Lett. 111, Aug. 2, 2017, 6 pgs.

Anderson, et al., "Optical Measurements of Strong Microwave Fields with Rydberg Atoms in a Vapor Cell", Phys. Rev. App. 5, Mar. 4, 2016, 8 pgs.

Black, "An introducton to Pound-Drever-Hall laser frequency stabilization", American Journal of Physics 69, 79, Apr. 2000, 10 pgs.

Bohaichuk, et al., "The Origins of Rydberg Atom Electrometer Transient Response and its Impact on Radio Frequency Pulse Sensing", arXiv:2203.01733, Mar. 3, 2022, 21 pgs.

Deschenes, et al., "Frequency-noise removal and on-line calibration for accurate frequency comb interference spectroscopy of acetylene", Applied Optics, vol. 53, No. 4, Feb. 1, 2014, 5 pgs.

Fan, et al., "Atom based RF electric field sensing", Journal of Physics B: Atomic, Molecular and Optical Physics, Sep. 9, 2015, 17 pgs.

Fan, et al., "Dispersive radio frequency electrometry using Rydberg atoms in a prism-shaped atomic vapor cell", J. Phys. B: At. Mol. Opt. Phys. 49, 2016, 8 pgs.

Fortier, et al., "20 years of developments in optical frequency comb technology and applications", Communications Physics, Dec. 6, 2019, 16 pgs.

Hebert, et al., "Real-Time Dynamic Atomic Spectroscopy Using Electro-Optic Frequency Combs", Oct. 25, 2016, 9 pgs.

Hebert, et al., "Self-heterodyne interference spectroscopy using a comb generated by pseudo-random modulation", Optics Express, Oct. 14, 2015, 13 pgs.

Holloway, et al., "Broadband Rydberg Atom-Based Electric-Field Probe: From Self-Calibrated Measurements to Sub-Wavelength Imaging", arXiv:1405.7066v1, May 27, 2014, 12 pgs.

Holloway, et al., "Sub-Wavelength Imaging and Field Mapping via EIT and Autler-Townes Splitting in Rydberg Atoms", arXiv:1404.0289v1, Apr. 1, 2014, 12 pgs.

Ji, et al., "Exploiting Ultralow Loss Multimode Waveguides for Broadband Frequency Combs", Laser & Photonics Reviews 15, 2000353, 2021, 14 pgs.

Jing, et al., "Atomic superheterodyne receiver based on microwave-dressed Rydberg spectroscopy", Nature Physics, vol. 16, Sep. 2020, 11 pgs.

Kumar, et al., "Atom-Based Sensing of Weak Radio Frequency Electric Fields Using Homodyne Readout", Scientific Reports 7:42981, Feb. 20, 2017, 10 pgs.

Kumar, et al., "Rydberg-atom based radio-frequency electrometry using frequency modulation spectroscopy in room temperature vapor cells", Optics Express, vol. 25, No. 8, Apr. 17, 2017, 13 pgs.

Long, et al., "Multiplexed sub-Doppler spectroscopy with an optical frequency comb", Phys.Rev.A, Dec. 2016, 10 pgs.

Marangos, et al., "Electromagnetically induced transparency", J. Modern Optics 45, 3, 1998, 33 pgs.

Metcalf, et al., "Stand-Alone High-Power Broadly Tunable Optoelectronic Frequency Comb Generator", OFC/NFOEC Technical Digest, JW2A. 15, 2013, 3.

Ozharar, et al., "Ultraflat Optical Comb Generation by Phase-Only Modulation of Continuous-Wave Light", IEEE Photonics Technology Letters, Jan. 1, 2008, 3 pgs.

Parriaux, et al., "Electro-optic frequency combs", Advances in Optics and Photonics, vol. 12, No. 1, Mar. 16, 2020, 65 pgs.

Picque, "Frequency comb spectroscopy", Nature Photonics, vol. 13, Mar. 2019, 12 pgs.

Rozwadowski, et al., "Measurement of the Density of Saturated Cesium Vapor by an Optical Method", The Journal of Chemical Physics, May 18, 2004, 5 pgs.

Schwettmann, et al., "Field-programmable gate array based locking circuit for external cavity diode laser frequency stabilization", Rev.Sci.Instrum. 82, Oct. 7, 2011, 7 pgs.

Sedlacek, et al., "Atom-Based Vector Microwave Electrometry Using Ribidium Rydberg Atoms in a Vapor Cell", Physical Review Letters, Aug. 6, 2013, 5 pgs.

Sedlacek, et al., "Microwave electrometry with Rydberg atoms in a vapour cell using bright atomic resonances", Nature Physics 8, Nov. 2012, 6 pgs.

Shaffer, et al., "A read-out enhancement for microwave electric field sensing with Rydberg atoms", SPIE Photonics Europe, 2018, Strasbourg, France, 2018, 11 pgs.

Simons, et al., "A Rydberg atom-based mixer: Measuring the phase of a radio frequency wave", Appl. Phys. Lett. 114, Mar. 18, 2019, 5 pgs.

Urabe, et al., "Absorption spectroscopy using interference between optical frequency comb and single-wavelength laser", App. Phys. Lett. 101, Jul. 31, 2012, 5 pgs.

Wu, et al., "Generation of very flat optical frequency combs from continuous-wave lasers using cascaded intensity and phase modulators driven by tailored radio frequency waveforms", Optics Letters, 35, 19, Sep. 23, 2010, 3 pgs.

Xue, et al., "Microresonator Kerr frequency combs with high conversion efficiency", Laser Photonics Rev. 11, Jan. 9, 2017, 7 pgs.

Zhang, et al., "Rydberg microwave frequency comb spectrometer", arXiv:2206.06572v1, Jun. 14, 2022, 10 pgs.

Gordon, Joshua A., et al., "Millimeter Wave Detection via Autler-Townes Splitting in Rubidium Rydberg Atoms", Applied Physics Letters, 105(2):024104, Jun. 2014, 5 pages.

WIPO, International Search Report and Written Opinion issued in Application No. PCT/CA2023/050914 dated Sep. 19, 2023, 8 pages.

* cited by examiner

DETECTING RADIO FREQUENCY ELECTROMAGNETIC RADIATION USING VAPOR CELL SENSORS AND COMB SPECTRA

CROSS-REFERENCE TO RELATED APPLICATIONS

This application claims priority to U.S. Prov. App. No. 63/392,404, which was filed on Jul. 26, 2022, and entitled, "Detecting Radio Frequency Electromagnetic Radiation Using Vapor Cell Sensors." The disclosure of the priority application is hereby incorporated by reference in its entirety.

BACKGROUND

The following description relates to detecting radio frequency electromagnetic radiation using vapor cell sensors.

A vapor cell sensor may include a vapor or gas within an enclosed volume, such as a volume defined by a chamber. The vapor or gas may be used as a medium to interact with radio frequency (RF) electromagnetic radiation that is incident upon the vapor cell sensor. Beams of light, such as generated by lasers, may be directed through the vapor or gas to probe and measure a response of the vapor or gas to the RF electromagnetic radiation. In this way, the vapor cell sensor may detect the RF electromagnetic radiation, and in many instances, help to determine properties of the RF electromagnetic radiation.

DETAILED DESCRIPTION

Figure 1:
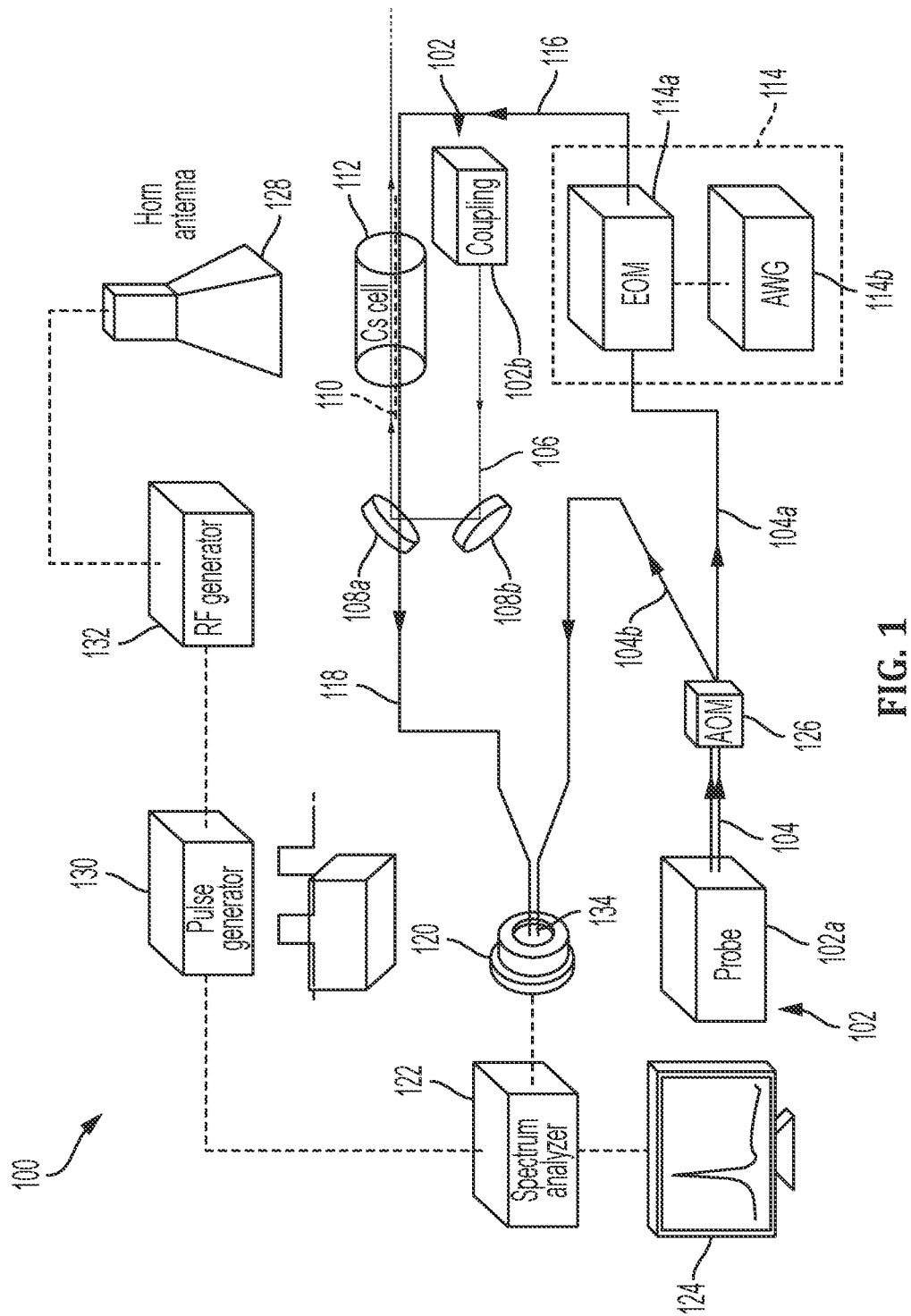
FIG. 1 is a schematic diagram of an example system for detecting radio frequency electromagnetic radiation.

In a general aspect, systems are described herein that can detect radio frequency (RF) electromagnetic radiation. In many implementations, the systems include a vapor cell sensor that is configured to sense RF electromagnetic radiation using a vapor that has one or more atomic Rydberg states. The vapor may undergo a change in electromagnetically induced transparency (EIT) or electromagnetically induced absorption (EIA) when interacting with RF electromagnetic radiation. These changes may alter an optical transmission spectrum of the vapor. The systems also include an optical comb generator that is configured to generate a comb spectrum in response to receiving a beam of light (e.g., a beam of laser light). The comb spectrum includes comb lines at respective comb frequencies and is used to probe the vapor at multiple comb frequencies.

The sensing of RF electromagnetic fields using atomic Rydberg states is a promising, high-sensitivity technique that can offer extraordinary sensing bandwidth. Vapor cell sensors, which contain a vapor of Rydberg atoms or molecules, can also offer an all-dielectric construction that minimally perturbs RF electromagnetic fields, if at all. In contrast, antennas are typically constructed of metallic materials, which can distort RF electromagnetic fields. In some instances, the systems described herein detect RF electromagnetic fields using, in part, a vapor cell sensor and an optical comb generator. During operation, the optical comb generator produces an optical signal that detects (e.g., measures) optical properties of the vapor, including changes in a transparency of the vapor induced by an RF electromagnetic field. The optical signal corresponds to a comb spectrum that has comb lines at respective comb frequencies. In many implementations, the system includes a probe laser and a coupling laser. The optical comb generator receives a probe beam of light from the probe laser to produce the comb spectrum. The coupling laser produces a coupling beam of light that is tuned to the Rydberg launch state of the vapor.

In some implementations, self-heterodyne spectroscopy is achieved by mixing the comb spectrum with a local oscillator signal obtained from the probe laser and shifted with an acousto-optic modulator. In some variations, an electro-optic modulator and an arbitrary waveform generator is used to emit a chirped-sine function. The chirped-sine function may, for example, produce a flat frequency comb spectrum with a tooth spacing of 10 kHz and frequency span of 100 MHz. In these variations, the electromagnetically induced transmission line shapes may be resolved with linewidths below 5 MHz both with and without laser locking. Moreover, the Autler-Townes splitting of the transmission peak may be measured and RF electromagnetic fields as low as 66 $\mu V^{cm-1}$ may be detected with sensitivities of 2.3 $\mu V^{cm-1}$ $Hz^{-1/2}$. The corresponding detection method can offer a significant simplification to reading out Autler-Townes splitting since, in many instances, neither the probe nor coupling lasers need to be tuned and slow drifts of the lasers can be tolerated. Furthermore, the detection method allows for sensing pulsed RF electromagnetic fields (e.g., amplitudes thereof) when the incoming RF electromagnetic field splits, via an Autler-Townes process, the electromagnetically induced transmission peak.

Now referring to FIG. 1, a schematic diagram is presented of an example system 100 for detecting radio frequency (RF) electromagnetic radiation. In some implementations, the example system 100 uses an electro-optical comb for Rydberg atom-based electrometry with EIT-based or EIA-based transmission spectra. In some implementations, the example system 100 performs self-calibrated absolute power measurements by measuring the frequency splitting of a spectral line shape. The spectral line shape is based on the precise electronic transitions of a vapor, and as such, measurements based on its features (e.g., the frequency splitting) may be self-calibrated. The frequency splitting may correspond to the separation of two peaks in the spectral line shape, an example of which, is shown in the lower right portion of FIG. 2B. In these implementations, the example system 100 may experimentally measure a value of the frequency splitting, such as by operation of an optical detector. The example system 100 may then use this measured value to determine the electric field strength of an RF electromagnetic radiation interacting with the vapor. Equation (1) below provides an example of how the measured value (e.g., $\Omega_{RF}$) can be used to determine the electric field strength of the RF electromagnetic radiation (E). Other types of applications and measurements are possible.

The example system 100 includes a laser system 102 configured to generate laser signals (e.g., beams of laser light) that include first and second laser signals 104, 106 (e.g., first and second beams of laser light). For example, the laser system 102 may include a probe laser 102a and a coupling laser 102b that are configured to generate, respectively, a probe laser signal 104 and a coupling laser signal 106. Examples of such lasers include a semiconductor laser, a fiber laser, an amplified laser, and so forth. The probe laser 102a and the coupling laser 102b may, in some instances, be locked to respective reference frequencies. Moreover, the laser system 102 may, in some instances, include a third laser configured to generate a third laser signal. Additional lasers are possible. The example system 100 may include optical elements such as lenses, mirrors, diffraction gratings, beam splitters, and so forth to define one or more optical pathways for the laser signals. FIG. 1 illustrates two mirrors 108a, 108b for directing the coupling laser signal 106 along an optical pathway 110 that runs counter to the probe laser signal 104 (or derivative thereof). However, other numbers and configurations of optical pathways are possible.

The example system 100 also includes a vapor cell sensor 112 having a vapor therein. In many instances, the vapor is a vapor of Rydberg atoms or molecules, such as a gas of Group IA atoms (e.g., Cs or Rb). The vapor cell sensor 112 may also have a body or housing that encloses an internal volume for containing the vapor. The body or housing may be formed of a dielectric material, such as silicon, silicon oxide, or borosilicate glass. Other dielectric materials are possible. Example configurations of the vapor cell sensor 112, including examples of dielectric materials therefor, are described in U.S. Pat. No. 10,859,981 entitled "Vapor Cells Having One or More Optical Windows Bonded to a Dielectric Body."

In some variations, the probe laser signal 104 has a probe frequency matched to a probe optical electronic transition of the vapor and the coupling laser signal 106 has a coupling frequency matched to a coupling optical electronic transition of the vapor. The coupling optical electronic transition may share an energy level in common with the probe optical electronic transition. For example, the vapor may include first, second, and third electron energy levels that are each progressively higher in energy. The probe optical electronic transition may be defined by a first energy gap between the first and second electron energy levels, and the coupling optical electronic transition may be defined by a second energy gap between the second and third electron energy levels. However, other arrangements of electron energy levels may be possible (e.g., an arrangement in which one or more subsequent electron energy levels are lower than a starting electron energy level).

In these variations, the vapor includes an RF electronic transition that is configured to alter, in response to absorbing RF electromagnetic radiation, an absorption of light by one or both the probe and coupling optical electronic transitions. The RF electronic transition may correspond to an electronic transition that is defined by a pair of electron energy levels, at least one of which, is different than the first, second, and third electron energy levels. The RF electronic transition may have a third energy gap that is smaller in magnitude than the first and second energy gaps of, respectively, the first and second optical electronic transitions. In variations where the laser system 102 is configured to generate laser signals in addition to the probe and coupling laser signals 104, 106, the additional laser signals may have respective frequencies that are matched to different optical electronic transitions of the vapor. In certain cases, the absorption of light by these optical electronic transitions may also be altered by the RF electronic transition.

Figure 2A:
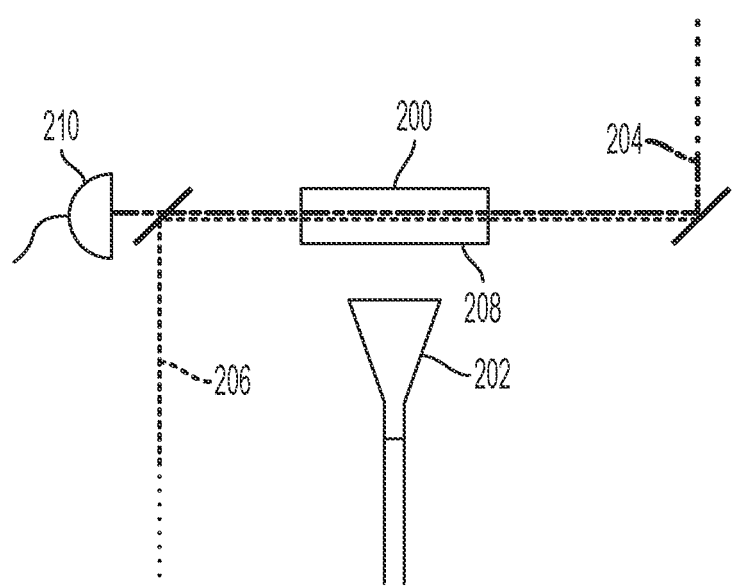
FIG. 2A is a schematic diagram of an example vapor cell sensor positioned proximate an antenna that is configured to generate RF electromagnetic radiation.

FIG. 2A presents a schematic diagram of an example vapor cell sensor 200 positioned proximate an antenna 202 that is configured to generate RF electromagnetic radiation. The example vapor cell sensor 200 is configured to receive input optical signals (e.g., laser signals), and in response, generate one or more output optical signals. In FIG. 2A, the example vapor cell sensor 200 receives a probe laser signal 204 and a coupling laser signal 206. The probe laser signal 204 and the coupling laser signal 206 may be generated by respective lasers. Examples of such lasers include a semiconductor laser, a fiber laser, an amplified laser, a tunable semiconductor laser, and so forth. The probe laser signal 204 and the coupling laser signal 206 pass through the example vapor cell sensor 200 along a common optical pathway. A direction of travel along the common optical pathway may be the same for both beams. However, in some variations, such as shown in FIG. 2A, the laser signals travel in opposite directions along the common optical pathway. Other optical geometries may be possible by angle tuning the laser signals to eliminate Doppler shifts.

While passing through the example vapor cell sensor 200, the probe and coupling laser signals 204, 206 interact with a vapor that is contained within an enclosure of the example vapor cell sensor 200. A side 208 of the enclosure facing the antenna 202 may be formed of a dielectric material that is transparent to the electromagnetic radiation, thereby serving as a window for the electromagnetic radiation. Other sides of the enclosure may also be formed of the dielectric material. Concomitant with receiving the probe laser signal 204 and the coupling laser signal 206, the example vapor cell sensor 200 may also receive RF electromagnetic radiation from the antenna 202 through the side 208 of the enclosure. The RF electromagnetic radiation may alter an optical transmission of the probe laser signal 204 through the example vapor cell sensor 200, which is detected (e.g., measured) by an optical detector 210 (e.g., a photodiode). Measurements of the optical transmission or the probe laser signal 204 may allow the example vapor cell sensor 200 to detect and measure characteristics of the RF electromagnetic radiation. In many cases, this alteration results from the RF electromagnetic radiation altering an absorption coefficient of the vapor (e.g., to a wavelength of the probe laser signal 204).

Figure 2B:
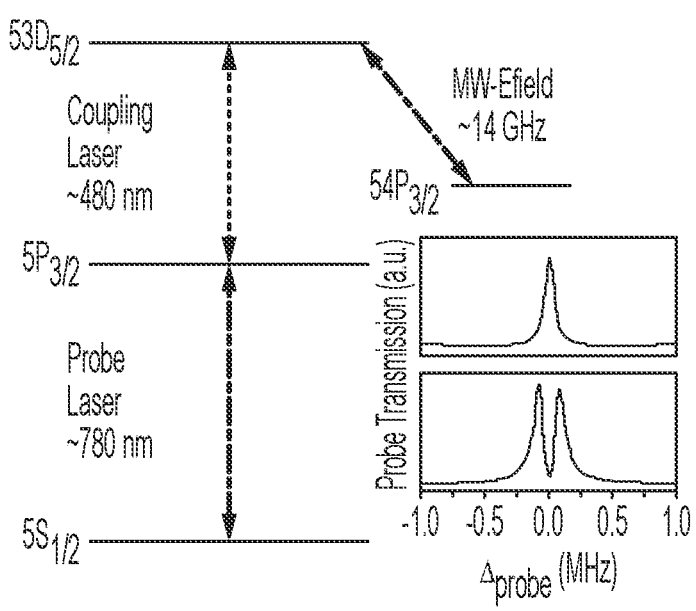
FIG. 2B is a schematic diagram of an example electron energy level structure for a two-photon measurement based on Rb atoms in a vapor state.

Measurements of characteristics of the RF electromagnetic radiation may rely on two or more optical electronic transitions associated with the vapor. For instance, FIG. 2B presents a schematic diagram of an example electron energy level structure for a two-photon measurement based on Rb atoms in a vapor state. In FIG. 2B, laser light is used to access the $5S_{1/2}$-to-$5P_{3/2}$ optical electronic transition and the $5P_{3/2}$-to-$53D_{5/2}$ optical electronic transition. For example, a probe laser signal with a frequency of approximately 780 nm may be used to access the $5S_{1/2}$-to-$5P_{3/2}$ optical electronic transition and a coupling laser signal with a frequency of approximately 480 nm may be used to access the $5P_{3/2}$-to-$53D_{5/2}$ optical electronic transition. However, other types of lasers or a laser system may be used. The inset in the lower right of FIG. 2B shows a spectral line shape of the optical transmission of the probe laser signal through the Rb vapor. The upper portion of the inset corresponds to the absence of RF electromagnetic radiation, and the lower portion of the inset corresponds to the presence of RF electromagnetic radiation. The inset thus shows that the spectral line shape can change when RF electromagnetic radiation interacts with the Rb vapor. In some instances, such as shown in FIG. 2B, a frequency range of the spectral line shape is centered about the frequency of the probe laser signal. In some instances, the spectral line shape is symmetrical about this center.

During measurement of RF electromagnetic radiation, the transmission of light from the probe laser 204 is recorded in the presence of light from the coupling laser 206. An RF electromagnetic radiation of approximately 14 GHz may, for example, interact with the $54P_{3/2}$-to-$53D_{5/2}$ optical electronic transition of the vapor to alter a magnitude of the transmission. If the RF electromagnetic radiation is not interacting with the Rb vapor, a narrow peak in the optical transmission of the probe beam of light is observed where the probe laser signal would normally be absorbed, as shown in the upper graph of the inset of FIG. 2B. Such a phenomenon may be referenced as an electromagnetically induced transparency (EIT). EIT may arise from the interference between different possible absorption pathways setup by the interaction of the vapor with the light fields. Absorption by the vapor is suppressed by such interference, which enhances transmission through the normally absorbing vapor. Other phenomenon may be possible. For example, electromagnetically induced absorption (EIA) may also arise from the interference between different possible absorption pathways, but in this case, absorption of the vapor (less transmission) is enhanced. In some instances, a third laser signal can be used to induce EIA. In these instances, the probe and coupling laser signals produce EIT, but the third laser signal is used to induce an absorption feature within the EIT spectral line shape. Moreover, by applying different de-tunings of the laser signals relative to the optical electronic transitions of the vapor, the laser signals can also be setup to create a mode where EIT is used to measure characteristics of the RF electromagnetic radiation.

When the RF electromagnetic radiation interacts with the Rb atoms in the vapor—and in particular, when the RF electromagnetic radiation has an electric field component near-resonant or resonant with a third optical electronic transition of the Rb vapor—an absorption feature is induced within the narrow peak of probe light transmission, as shown in the lower portion of the inset. The absorption feature may split the narrow peak of probe light transmission into two transmission peaks. Measurements of the narrow peaks and the absorption feature can be sensitive to the RF electromagnetic radiation experienced by the example vapor cell sensor 200 because the Rydberg atom transitions have large transition dipole moments and the amplitude is converted to a frequency difference. Since EIT is a coherent multi-photon process, it is sub-Doppler so it can be done in a vapor cell sensor with high spectral resolution.

Now referring back to FIG. 1, the example system 100 includes an optical comb generator 114 that is configured to generate a comb spectrum 116 in response to receiving the probe laser signal 104 (or portion 104a thereof). In the example shown in FIG. 1, the comb spectrum 116 is an optical signal produced by the optical comb generator 114, and the optical signal has a comb-shaped frequency profile that is defined by comb lines at respective comb frequencies. The optical comb generator 114 may be based on an electro-optic modulator, a mode-locked laser, an optical micro-resonator, a nonlinear optical fiber, or an acousto-optic modulator. Other types of optical comb generators are possible. In some variations, the optical comb generator 114 includes an electro-optic modulator (EOM) 114a and an arbitrary waveform generator (AWG) 114b. The electro-optic modulator 114a may be in communication with the arbitrary waveform generator 114b. Although FIG. 1 illustrates a single electro-optic modulator 114a in communication with a single arbitrary waveform generator 114b, other configurations of these components are possible. For example, the optical comb generator 114 may include two or more electro-optic modulators in communication with a single arbitrary waveform generator. As another example, the optical comb generator 114 may include multiple electro-optic modulators in communication with different, respective arbitrary waveform generators. These configurations may allow the optical comb generator 114 to increase a number of comb lines in the comb spectrum 116, increase a bandwidth of the comb spectrum 116, or both. Other benefits are possible.

The vapor of the vapor cell sensor 112 is configured to generate an optical spectrum 118 based on interactions of the comb spectrum 116 and the coupling laser light 106 with the vapor. In the example shown in FIG. 1, the optical spectrum 118 is an optical signal that is provided to an optical detector 120 (e.g., a photodiode). The example optical spectrum 118 represents an optical transmission of the vapor at the comb frequencies. The optical spectrum 118 also includes a property (e.g., an amplitude, a polarization, a phase, etc.) that changes in response to RF electromagnetic radiation interacting with the vapor. Such change in the optical spectrum 118 produced by the vapor cell sensor 112 may correspond to a change in a property (e.g., change in power, angular orientation, angular shift, etc.) of the RF electromagnetic radiation. In many cases, a detectable change in the property of the optical spectrum 118 allows the example system 100 to detect RF electromagnetic radiation incident on the vapor cell sensor 100 and to determine one or more properties of the RF electromagnetic radiation.

The example system 100 includes the optical detector 120, which is configured to detect (e.g., measure) the property of the optical spectrum 118 at one or more of the comb frequencies. In some variations, the optical detector 120 is configured to detect the property of the optical spectrum 118 at multiple comb frequencies (e.g., a subset of comb frequencies, all comb frequencies, etc.). For example, the optical detector 120 may be configured to detect the property of the optical spectrum 118 at two or more comb frequencies, and such detection may occur simultaneously (e.g., concurrently) at the two or more comb frequencies. In some instances, the optical detector 120 is configured to detect the property of the optical spectrum 118 simultaneously at all comb frequencies. Examples of the property include an amplitude of the optical spectrum 118, a polarization of the optical spectrum 118, a phase of the optical spectrum 118, or a combination thereof. Other properties of the optical spectrum 118 may be detected.

During operation, the optical comb generator 114 may allow the example system 100 to determine a profile of the EIT-based or EIA-based peak across a large bandwidth. For example, each comb frequency of the comb spectrum 116 may allow the example system 100 to measure the peak simultaneously at multiple frequencies across a range of frequencies occupied by the peak. Such simultaneous measurement is notably faster than measuring individual frequencies iteratively across the range. Simultaneous measurement may also allow the example system 100 to determine the profile of the peak more accurately, especially under conditions where the peak rapidly changes in response to fluctuations of the RF electromagnetic radiation.

Figure 3:
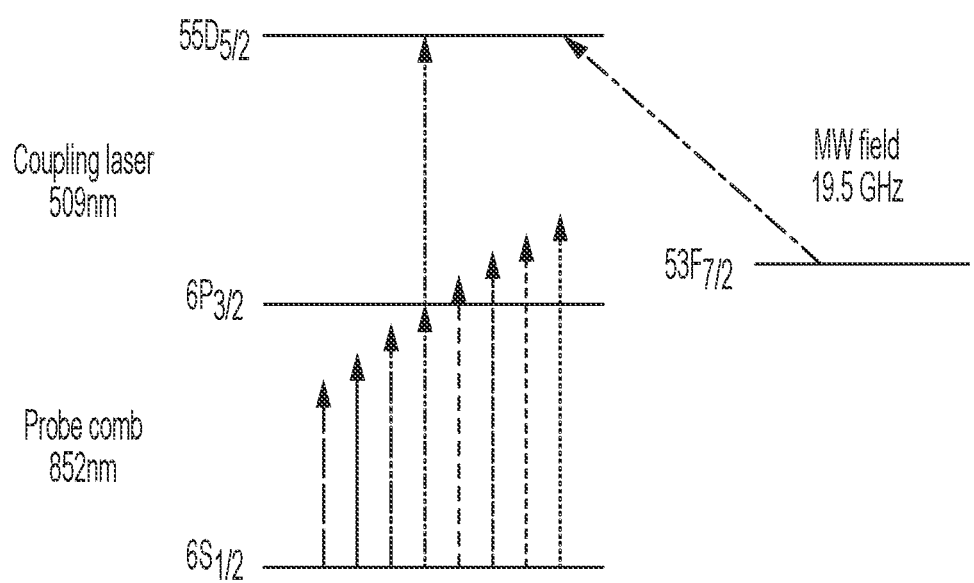
FIG. 3 is a schematic diagram of an example electron energy level structure for a two-photon measurement that uses a frequency comb and is based on Cs atoms in a vapor state.

FIG. 3 presents a schematic diagram of an example electron energy level structure for a two-photon measurement based on Cs atoms in a vapor state. A comb spectrum is used to interact with the $6S_{1/2}$-to-$6P_{3/2}$ optical electronic transition, as shown by the multiple comb lines extending from the $6S_{1/2}$ energy level towards the $6P_{3/2}$ energy level (or thereabouts). The comb spectrum is generated from a probe laser signal having a frequency of approximately 852 nm and may be analogous to the comb spectrum 116 described in relation to FIG. 1. A coupling laser signal having a frequency of approximately 509 nm is used interact with the $6P_{3/2}$-to-$55D_{5/2}$ optical electronic transition. In FIG. 3, the comb spectrum is illustrated with eight example comb lines. However, other numbers of comb lines are possible. For example, the comb spectrum may include 10,000 comb lines that span a frequency range (or bandwidth) of 100 MHz. Moreover, the comb lines may have various respective powers that define a power profile (e.g., a uniform profile, a gradient profile, a sinusoidal profile, etc.). For example, the comb lines may be relatively uniform in profile within a power variation within 3.06 dB.

The Cs atoms in a vapor state also have an $53F_{7/2}$-to-$55D_{5/2}$ optical electronic transition. RF electromagnetic radiation may interact with this transition, thereby altering an absorption of light by one or both of the $6S_{1/2}$-to-$6P_{3/2}$ optical electronic transition and the $6P_{3/2}$-to-$55D_{5/2}$ optical electronic transition. For example, and as shown in FIG. 3, an RF electromagnetic radiation of approximately 19.5 GHz may be used to alter an absorption of the comb spectrum by the $6S_{1/2}$-to-$6P_{3/2}$ optical electronic transition. Such absorption may serve as a basis for detecting the RF electromagnetic radiation as well as measuring characteristics of the RF electromagnetic radiation. The presence of multiple comb lines allows the profile of the EIT peak (e.g., its spectral line shape) to be resolved simultaneously at multiple frequencies. This capability stands in contrast to the probe laser light illustrated in FIG. 2B, whose single frequency would need to be altered to iteratively resolve the full optical transmission spectrum. The accuracy of such iterative scanning is susceptible to changes in the optical transmission spectrum or lasers during the period of the scan.

Now referring back to FIG. 1, the example system 100 may, in some implementations, include a spectrum analyzer 122 in communication with the optical detector 120. The spectrum analyzer 122 is configured to generate data representing the property of the optical spectrum 118 at the one or more comb frequencies. In many variations, the spectrum analyzer 122 is configured to generate data representing the property of the optical spectrum 118 at multiple comb frequencies (e.g., a subset of comb frequencies, all comb frequencies, etc.). For example, the optical detector 120 may be configured to detect the property of the optical spectrum 118 at two or more comb frequencies, and the spectrum analyzer 122 is configured to generate data representing the property of the optical spectrum 118 at the two or more comb frequencies. In further implementations, the example system 100 may include a computer 124 in communication with the spectrum analyzer 122. The computer 124 may have one or more processors and a memory configured to store instructions for the one or more processors. The instructions, when executed by the one or more processors, may be configured to perform operations such as determining, based on the data generated by the spectrum analyzer 122, an amplitude of the RF electromagnetic radiation, a polarization of the RF electromagnetic radiation, a phase of the RF electromagnetic radiation, or a combination thereof.

In some implementations, the example system 100 includes an acousto-optic modulator (AOM) 126 configured to split the probe laser signal 104 into first and second portions 104a, 104b. The first portion 104a is received by the optical comb generator 114 and is used to generate the comb spectrum 116. The second portion 104b may have a frequency higher than that of the first portion and may be received by the optical detector 120.

In some implementations, RF electromagnetic radiation (e.g., RF pulses or other forms of RF radiation) are received by the vapor cell sensor 112. The RF electromagnetic radiation may be generated by an antenna or another type of RF generating apparatus that is located remote from the example system 100. The antenna or apparatus may operate independent of the example system 100. In some cases, the example system 100 may include a source of the RF electromagnetic radiation. The source of the RF electromagnetic radiation may be configured to emit the RF electromagnetic radiation towards the vapor cell sensor 112. In FIG. 1, the source of the RF electromagnetic radiation is illustrated as a horn antenna 128. However, other types of sources are possible (e.g., another type of antenna). In further implementations, the example system 100 may include a pulse generator 130 and an RF generator 132. The pulse generator 130 may be in communication with the RF generator 132 and may be configured to generate signals representing respective pulses (e.g., shapes thereof) of the RF electromagnetic radiation. For example, the pulse generator 130 may produce a square wave with a frequency of 1 Hz and a duty cycle of 50%. However, other types of signals are possible (e.g., sinusoidal, saw-tooth, discrete, etc.). The RF generator 132 is configured to generate the pulses of RF electromagnetic radiation in response to receiving the signals from the pulse generator 130. In the example shown in FIG. 1, the RF pulses are emitted by the horn antenna 128, for example, as short bursts of RF energy that radiate from the horn antenna 128.

In operation, the example system 100 may be used to detect the RF electromagnetic radiation (e.g., pulses of the RF electromagnetic radiation). Such detection may include determining characteristics of the RF electromagnetic radiation. For example, the example system 100 may receive the RF electromagnetic radiation at a vapor cell sensor 112. The RF electromagnetic radiation may be generated by any source of RF electromagnetic radiation (e.g., horn antenna 128, an unknown source, a remote source, etc.). The example system 100 may also generate the comb spectrum 116 in response to receiving the probe laser signal 104 (or first portion 104a thereof) at the optical comb generator 114. The example system 100 may additionally generate the optical spectrum 118 by interacting the comb spectrum 116 and the coupling laser signal 106 with the vapor in the vapor cell sensor 112.

The optical detector 120 allows the example system 100 detect (e.g., measure) a property of the optical spectrum 118 at one or more comb frequencies. In many variations, the optical detector 120 allows the example system 100 detect the property of the optical spectrum 118 at multiple comb frequencies (e.g., a subset of comb frequencies, all comb frequencies, etc.). Such detection may occur simultaneously. For example, the example system 100 may detect the property at all comb frequencies simultaneously. The property of the optical spectrum 118 may be an amplitude of the optical spectrum 118, a polarization of the optical spectrum 118, a phase of the optical spectrum 118, or a combination thereof. However, other properties are possible. The example system 100 may also generate, by operation of the spectrum analyzer 122, data representing the property of the optical spectrum 118 at the one or more comb frequencies. If the RF electromagnetic radiation is being received by the vapor cell sensor 112, the computer 124 may determine an amplitude of the RF electromagnetic radiation, a phase of the RF electromagnetic radiation, a polarization of the RF electromagnetic radiation, or a combination thereof.

In some variations, the performance of the example system 100 may be improved by subtracting a background optical spectrum from the optical spectrum 118. For example, the example system 100 may generate a background optical spectrum by interacting the comb spectrum 116 with the vapor in the absence of the coupling laser signal 106. The background optical spectrum represents, at least in part, a background optical transmission of the vapor at the comb frequencies of the comb spectrum 116. The example system 100 also detects a property of the background optical spectrum at the one or more comb frequencies (e.g., a subset of comb frequencies, all comb frequencies, etc.). The property may be an amplitude of the background optical spectrum, a polarization of the background optical spectrum, a phase of the background optical spectrum, or a combination thereof. Other properties are possible. The spectrum analyzer 122 may then generate first and second data. The first data represents the optical property of the optical spectrum 118 at the one or more comb frequencies. Similarly, the second data represents the optical property of the background optical spectrum at the one or more comb frequencies. Using a difference between the first and second data, and when the RF electromagnetic radiation is being received by the vapor cell sensor 112, the computer 124 can determine an amplitude of the RF electromagnetic radiation, a phase of the RF electromagnetic radiation, a polarization of the RF electromagnetic radiation, or a combination thereof.

In some implementations, the example system 100 may generate a reference optical signal from the probe laser signal 104. The reference optical signal may serve as a local oscillator for the example system 100 and may allow the example system 100 to conduct self-heterodyne spectroscopic measurements. For example, the example system 100 may split the first laser signal 104 into first and second portions 104a, 104b using the acousto-optic modulator 126. The first portion 104a is received by the optical comb generator 114 to generate the comb spectrum 118. The second portion 104b is shifted by operation of the acousto-optic modulator 126 to a frequency higher than that of the first portion 104a. The second portion 104b, which serves as the reference optical signal (or local oscillator), may then be combined with the optical spectrum 118 from the vapor cell sensor 112 to produce a heterodyne optical spectrum 134. The example system 100 may subsequently detect a property of the heterodyne optical spectrum 134 at the one or more comb frequencies (e.g., a subset of comb frequencies, all comb frequencies, etc.). Examples of the property of the heterodyne optical spectrum 134 include an amplitude of the heterodyne optical spectrum 134, a polarization of the heterodyne optical spectrum 134, and a phase of the heterodyne optical spectrum 134. Other properties are possible.

The example system 100 can offer advantages over standard approaches for detecting RF electromagnetic radiation. For example, when the vapor cell sensor 112 is in an Autler-Townes sensing mode, standard practice would typically involve scanning at least one of the probe and coupling lasers 102a, 102b across the optical transmission spectrum to make a measurement. In cases where a pulse of the RF electromagnetic radiation is detected, the pulse may split the EIT-based or EIA-based peak and only a change in the optical transmission is observed. It can be of great advantage not to have to scan the probe or coupling lasers 102a, 102b. The comb spectrum 116 can overcome the challenges associated with scanning the probe and coupling lasers 102a, 102b. Other benefits are possible.

In some implementations, the comb spectrum 116 is generated using the electro-optic modulator 114a, which in turn, is driven by the arbitrary waveform generator 114b. The form of the drive signal from the arbitrary waveform generator 114b generates a comb spectrum whose spread of frequencies (or overall bandwidth) and comb tooth spacing can be controlled. The comb spectrum 116 is defined by a series of 'teeth' or comb lines whose density within a frequency range (or bandwidth) can be large enough to become quasi-continuous across the probe laser frequencies of interest. For example, the comb spectrum 116 may correspond to a sum of comb lines at discrete positions within the frequency range. One or both of the spacing between the comb lines and the bandwidth of the comb spectrum 116 may thus be controlled to make the comb spectrum 116 quasi-continuous. In some instances, a quasi-continuous comb spectrum 116 corresponds to a spacing that is greater than one half the line width of the probe laser signal 104a. In some instances, the comb spectrum 116 may be based on a frequency spacing between adjacent comb lines that is no greater than 100 kHz. In further instances, such as when a third laser signal is used, the frequency spacing is no greater than 10 kHz.

The probe laser 102a is chosen as the optical source for the comb spectrum 116 because it may be necessary to resolve the optical transmission associated with each comb line or detuning from resonance. To do so, the comb spectrum 116 may be beat (or combined) with the reference optical signal 104b (or local oscillator) after passing through the vapor cell sensor 112. The heterodyne optical spectrum 134 is based on a fundamental frequency of the probe laser 102a but shifted by a frequency such that a bandwidth of the comb spectrum 116 can be detected by the spectrum analyzer 122.

For example, if the bandwidth of the comb spectrum 116 is 100 MHz then the comb spectrum 116 might be up-shifted by 120 MHz so that the full bandwidth of the beat frequencies can be detected by a fast photodiode (e.g., the optical detector 120). A swept frequency spectrum analyzer can be used, or a real-time spectrum analyzer can be used. At frequencies less than 5 GHz, real-time digital signal processing solutions can be convenient for real, fieldable devices. In the amplitude regime, where the amplitude of the optical spectrum 118 is used to deduce the RF electromagnetic field amplitude, the method can still be useful since the entire line shape can be measured, reducing noise since small frequency fluctuations of the peak center can be observed and compensated. Analogous principles can be used to carry out comb spectroscopy using a three-photon process by modulating the probe laser 102a. Other multiphoton schemes may be possible.

In some implementations, the example system 100 allows frequency comb spectroscopy in which the probe and coupling lasers 102a, 102b do not have to be tuned. Enough power can be allocated to each comb line in the comb spectrum 116 to measure virtually all practical de-tunings simultaneously. Moreover, large laser fluctuations of up to 10 MHz can be compensated by signal processing, and as such, the lasers do not have to be precisely locked (although locking can still be advantageous). However, in certain instances, one or both of the probe and coupling lasers 102a, 102b are locked to a reference frequency. The reference frequency may be different for the probe and coupling lasers 102a, 102b.

In pulsed detection mode, it can be useful to know the absolute amplitude of the pulse of RF electromagnetic radiation. If the pulse splits the transmission peak, the signal received by the optical detector 120 may saturate the optical detector 120 and the pulse amplitude is unknown. By measuring with the comb spectrum 116, the Autler-Townes peak splitting can be measured, and the pulse amplitude determined. In the amplitude regime, measuring the entire peak may also help to determine the amplitude of the pulse because the change in peak height can be fit to models, leading to a better determination of the pulse amplitude. As such, the example system 100 can be useful for detecting pulses of RF electromagnetic radiation because pulse amplitude is important for applications like decluttering in radar. Currently, given the drift and variation of standard radar antennas, pulse amplitude detection is not viable. The example system 100 can open opportunities to use pulse amplitude detection in radar for applications like decluttering.

Figure 4A:
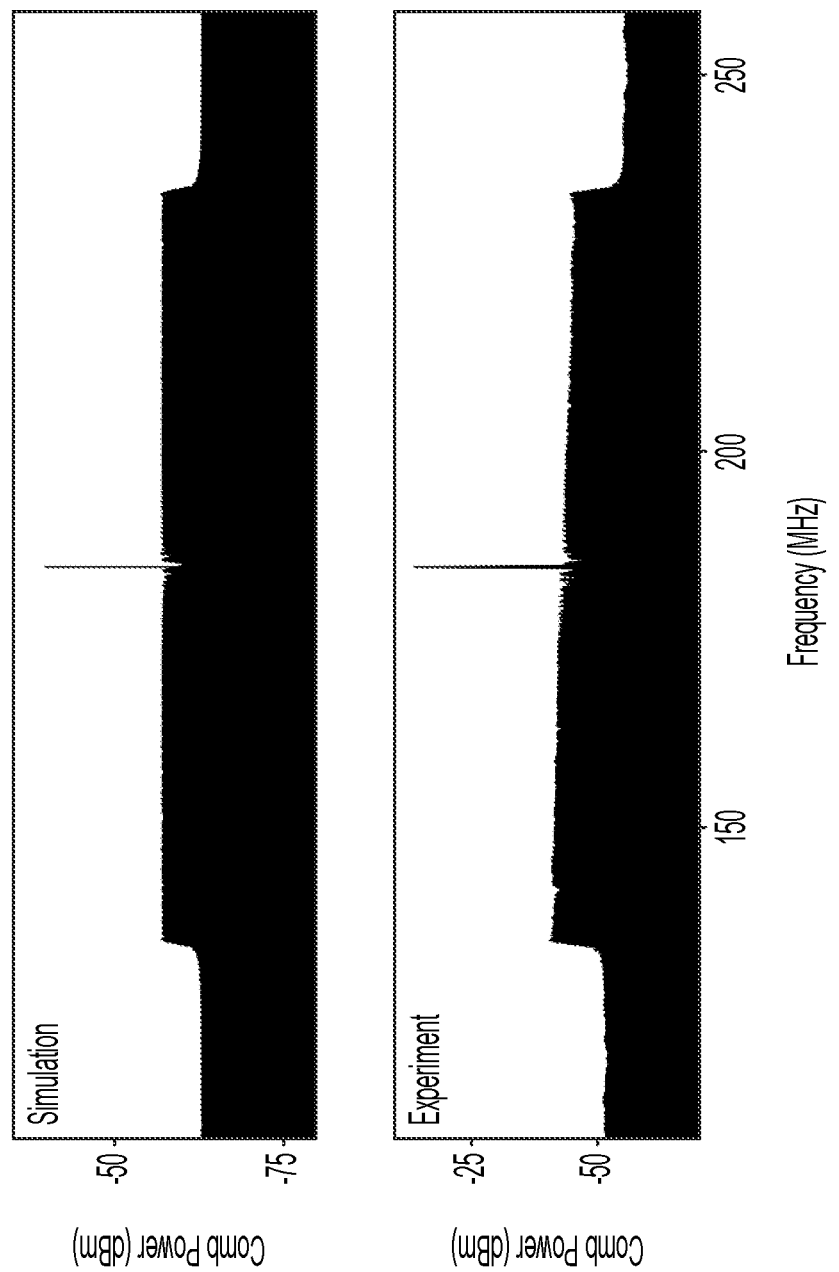
FIG. 4A is a graph showing an example comb spectrum as determined by simulation (top) and experiment (bottom)
Figure 4B:
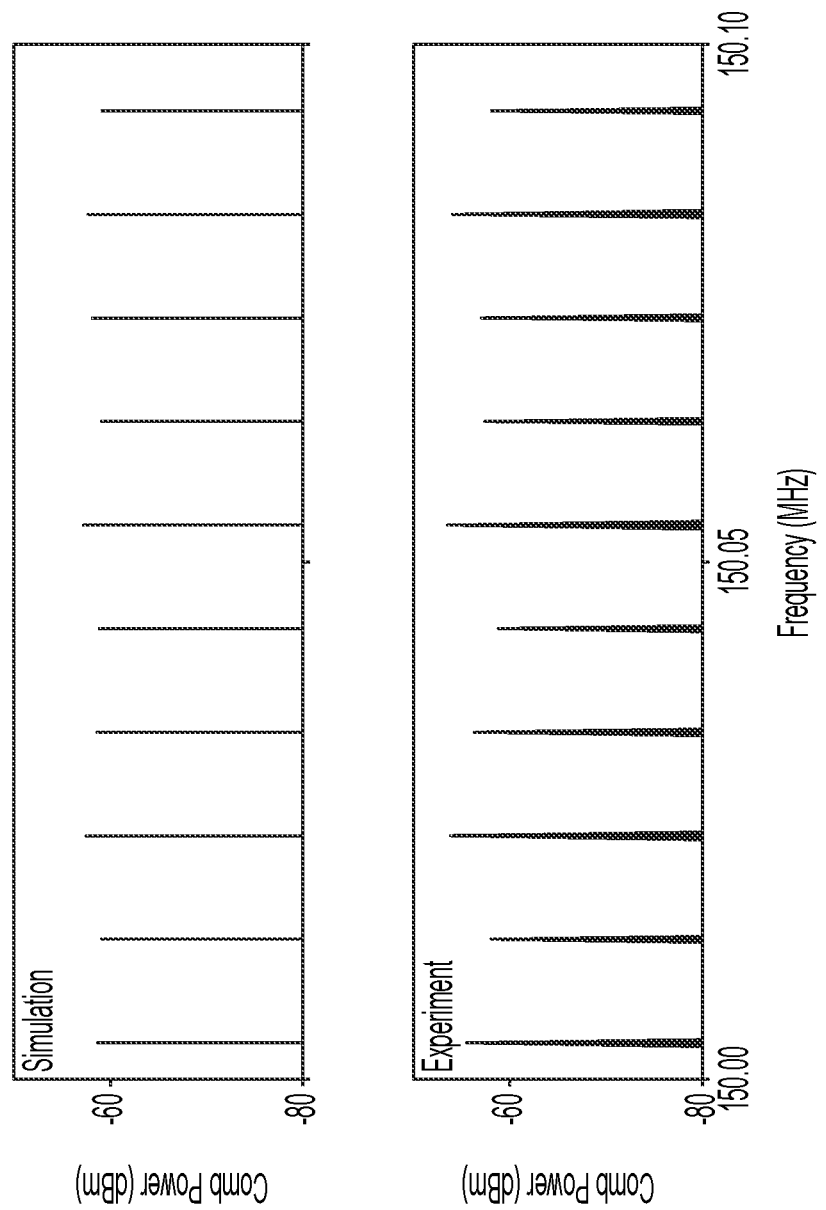
FIG. 4B is a magnified portion of the graph of FIG. 4A, showing individual teeth of the experimentally measured and simulated example comb spectrum in a frequency range from 150.00 MHz to 150.10 MHz.

Now referring to FIGS. 4A-4E, graphs are presented that show examples of comb spectra and optical transmission peaks. In particular, FIG. 4A presents a graph showing an example comb spectrum as determined by simulation (top) and experiment (bottom). FIG. 4B presents magnified portions of the graph of FIG. 4A, showing individual teeth of the experimentally measured and simulated example comb spectrum in a frequency range from 150.00 MHz to 150.10 MHz. The example comb spectrum has a frequency span of 100 MHz and is composed of 10000 teeth with a power variation of 3.06 dB. The experimentally measured comb spectrum bears excellent resemblance to the simulated comb spectrum, albeit with a slight change in tooth power across the comb width.

Figure 4C:
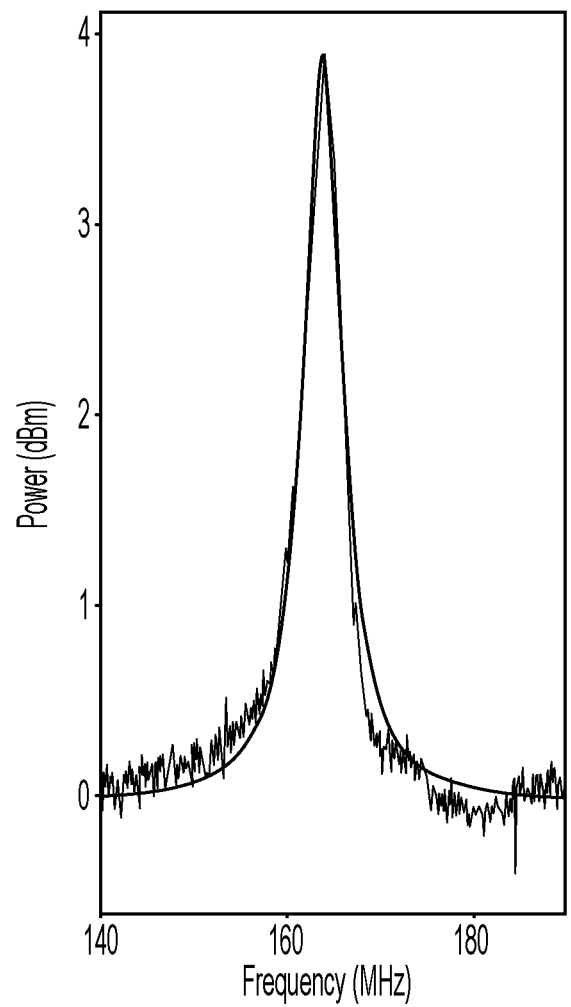
FIG. 4C is a graph showing an example of an electromagnetically induced transmission peak, obtained with a frequency comb, but in the absence of an RF electromagnetic field and with both probe and coupling lasers locked.

The example comb spectrum of FIGS. 4A-4B may be used to generate an optical transmission peak. For example, FIG. 4C presents a graph showing an example of an optical transmission peak, but in the absence of an RF electromagnetic field. The peak is obtained using the comb spectrum of FIGS. 4A-4B and with both probe and coupling lasers locked. However, a background spectrum was subtracted from the transmission signal to generate the peak. Fifty scans were averaged, with each scan being 200 ms in duration. A Lorentzian fit of the resulting transmission peak is shown, which has a full-width at half-maximum of 4.9 MHz.

Figure 4D:
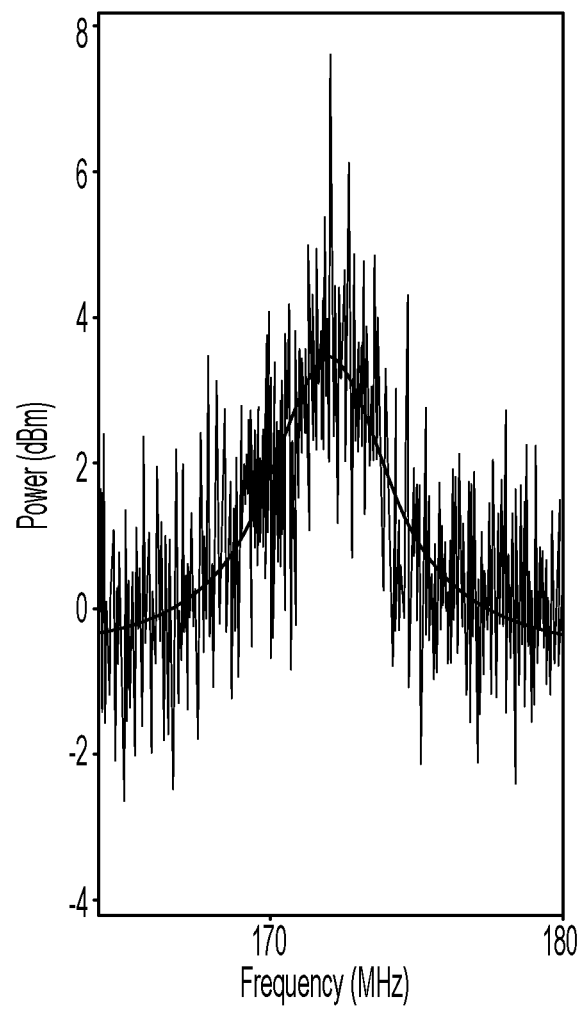
FIG. 4D is a graph showing an example of an electromagnetically induced transmission peak, obtained with a frequency comb, but in the absence of an RF electromagnetic field and with both probe and coupling lasers unlocked.
Figure 4E:
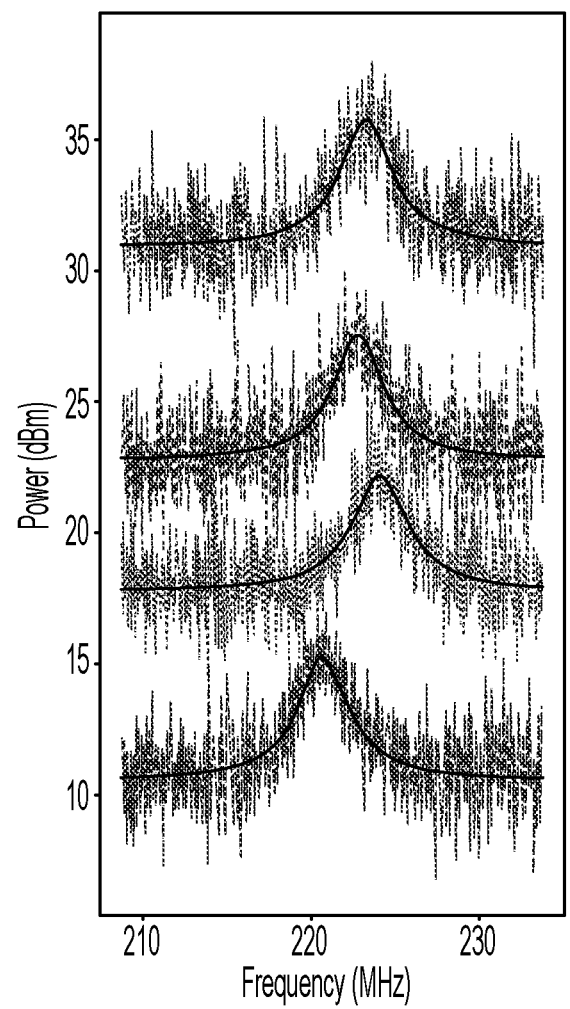
FIG. 4E is a graph showing examples of electromagnetically induced transmission peaks collected in succession using a frequency comb.

To illustrate the possibility of measuring transmission signals without locking the lasers, an transmission signal was also collected with both the coupling and probe lasers unlocked. The data was obtained with the example comb spectrum of FIGS. 4A-4B and free-running lasers is shown in the graph of FIG. 4D. Due to drift in the unlocked laser wavelengths, the scan time is reduced to 1 ms and no averaging is performed. The signal-to-noise ratio is reduced, but the peak is clearly visible. The optical transmission peak has a full-width at half-maximum of 4.7 MHz. The data shown in FIG. 4D demonstrates that the frequency comb enables the measurement of a transmission peak without laser locking. To illustrate the effects of laser drift and jitter on the transmission spectra, four transmission peaks, collected in succession, are shown in graph of FIG. 4E. The ability to probe the transmission spectrum without needing to lock either the probe or coupling laser is an advantage of frequency comb spectroscopy. Moreover, not having to scan the lasers greatly simplifies the optical control systems required to perform the measurement in some use cases.

Figure 5:
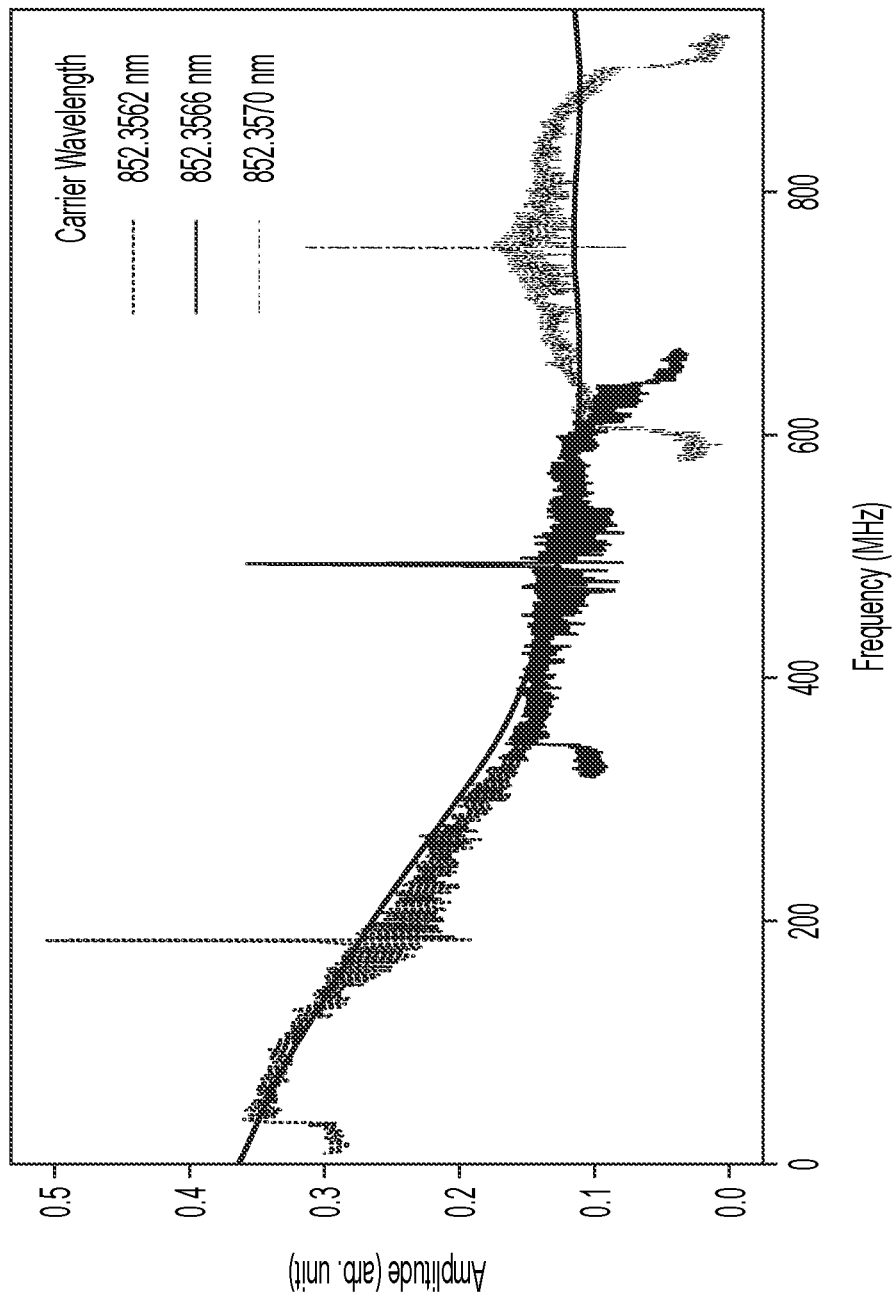
FIG. 5 is a graph showing examples of asymmetry in three frequency combs that are altered by a background absorption of Cs vapor in a vapor cell.

FIG. 5 presents a graph showing examples of asymmetry in three frequency combs (or comb spectra) that are altered by a background absorption of Cs vapor in a vapor cell. Such background absorption may result in a Doppler broadened spectrum. For example, the frequency combs may be affected by the Doppler broadened Cs background by detuning the frequency combs to different respective center frequencies. The frequency comb is detuned and the 'modulation' on top of the spectra can be used to map out the Doppler broadened spectrum of Cs. In FIG. 5, the comb spectra are passed through the vapor cell in the absence of a coupling laser signal.

In some variations, the RF electromagnetic field can induce an Autler-Townes splitting of the $55D_{5/2}$ peak that produces two transmission windows separated in frequency. The frequency separation may, in certain cases, be represented by Equation (1):

$$\Omega_{RF} = \frac{d \cdot E}{\hbar}. \qquad (1)$$

Figure 6A:
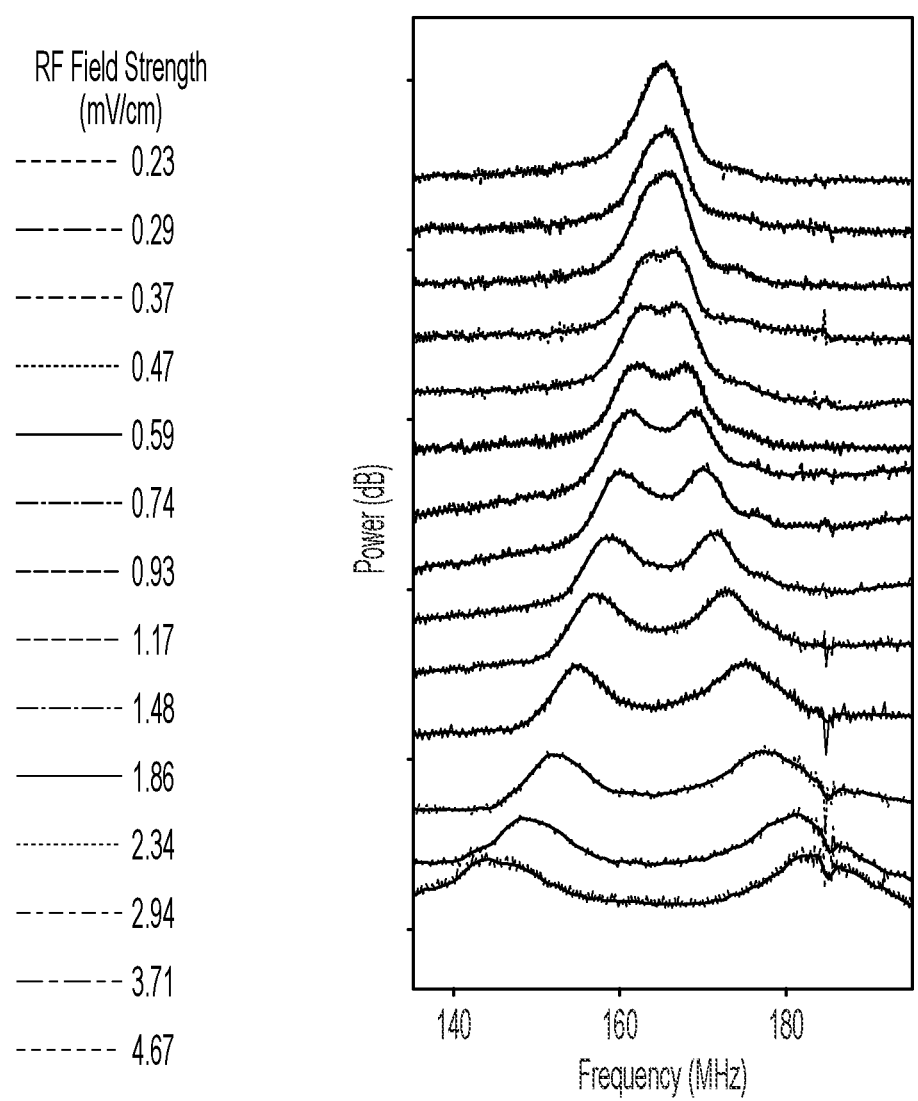
FIG. 6A is a graph showing examples of peak splitting, in an Autler-Towes regime and using a frequency comb, that result from increasing a strength of an RF electromagnetic field.
Figure 6B:
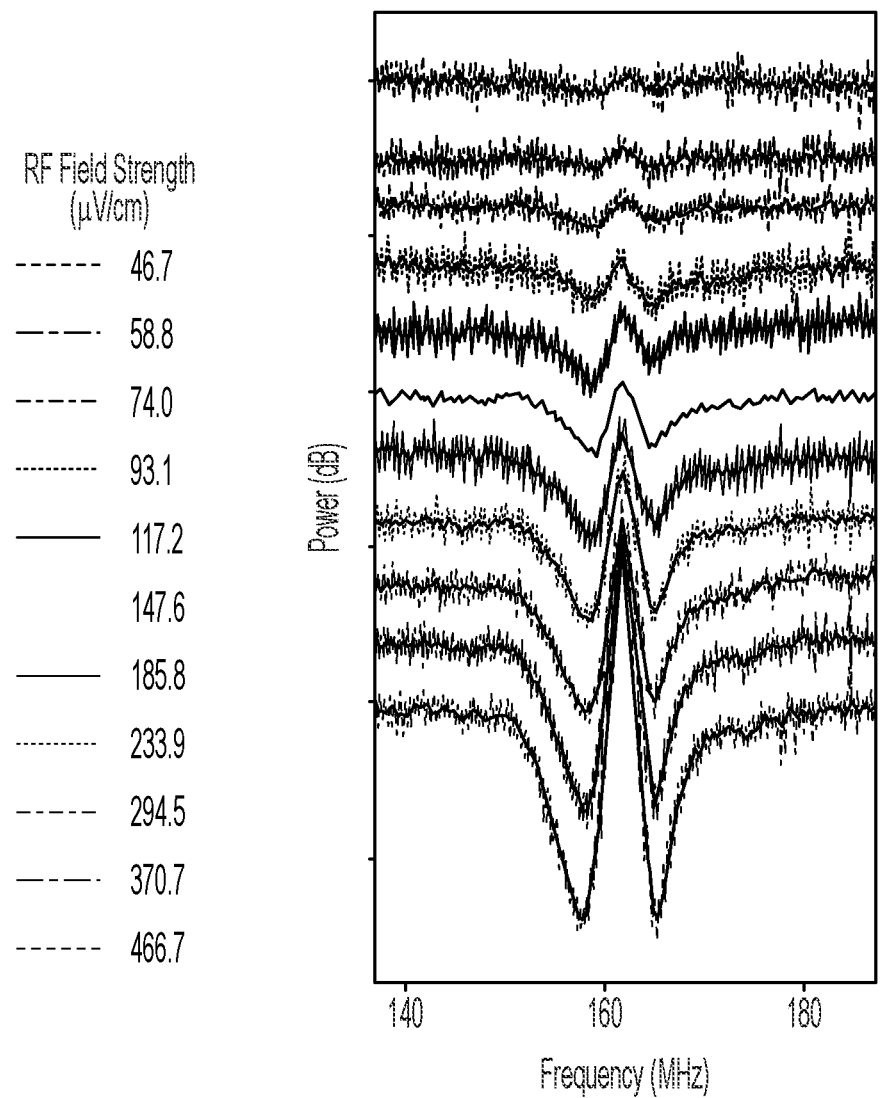
FIG. 6B is a graph showing examples of peak amplitude difference, in an amplitude regime and using a frequency comb, that result from increasing a strength of an RF electromagnetic field.
Figure 6C:
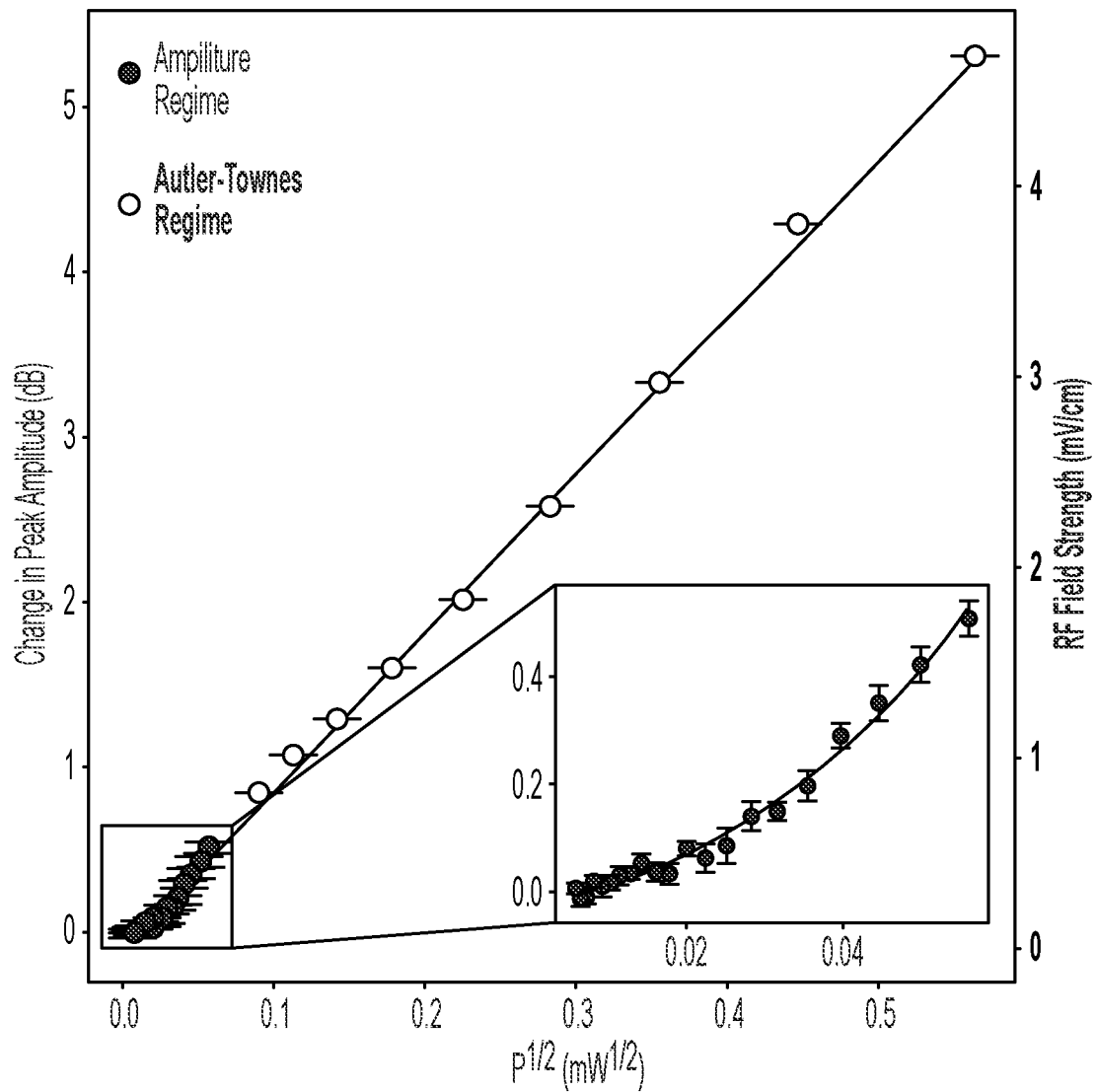
FIG. 6C is a graph showing examples of peaking splitting and amplitude change as a function of $\sqrt{P}$ for both Autler-Townes and amplitude regimes.

In Equation (1), the dipole moment of the transition is $d=6294ea_0$ and E is the electric field strength of the RF electromagnetic field. FIG. 6A shows the splitting of the EIT peak as a function of RF electric field strength in the Autler-Townes regime, as calculated using Equation (1). When the probe laser is scanned, a factor of $\lambda_p/\lambda_c$ can modify the spectral splitting due to the Doppler effect. To account for the slope in the comb profile shown in FIG. 4A, the split peaks can be leveled by subtracting a linear background fit. As the power output of the horn antenna is related to the electric field strength (e.g., $P \propto E^2$), the square root of the RF electromagnetic field power (P) may have a linear relationship to the spectral splitting of the EIT feature, which is illustrated in FIG. 6C.

At low RF electromagnetic field strengths, the magnitude of the transmission peak splitting may be difficult to measure directly but results in an amplitude reduction of the transmission peak. FIG. 6B shows the changes in peak amplitude for low radio frequency electromagnetic field powers. The difference in peak amplitude, as determined by averaging the peak amplitude over a 0.4 MHz span centered at 162 MHz, may become quadratic in the amplitude regime in certain cases. FIG. 6C shows an example of this quadratic relationship. The weakest detectable field, which can be defined as the last measurement before the change in peak amplitude drops below zero, is $66 \pm 0.4$ $\mu V$ $cm^{-1}$.

Figure 7A:
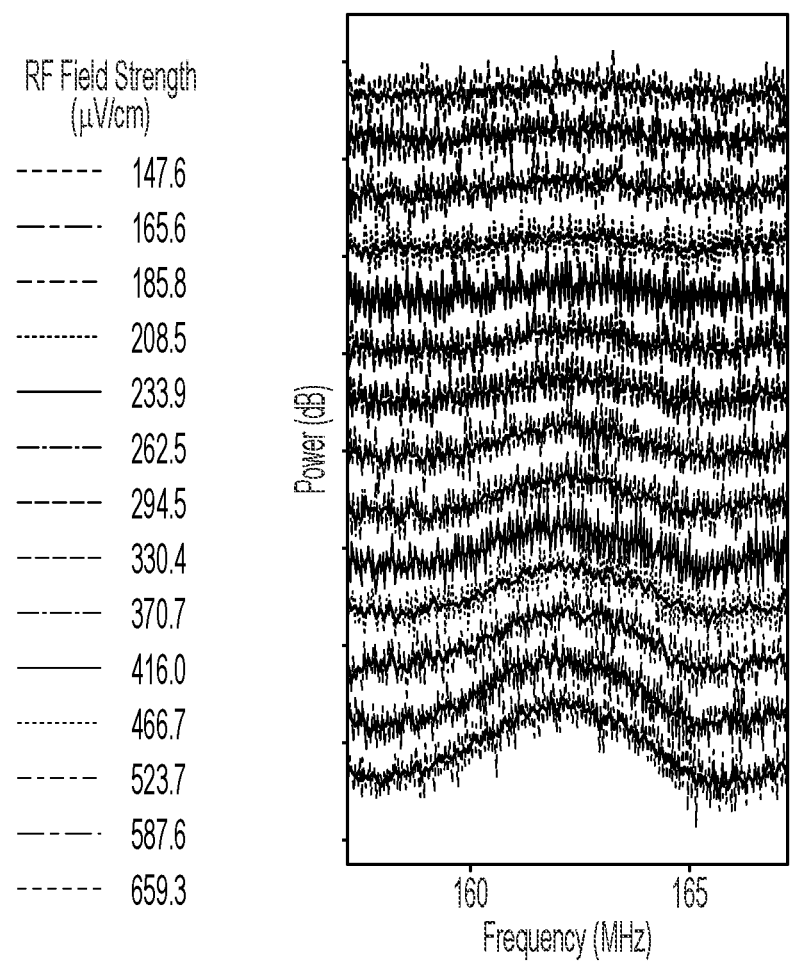
FIG. 7A is a graph showing examples of peak amplitude differences, using a frequency comb, that are induced by an RF electromagnetic field at various strengths.
Figure 7B:
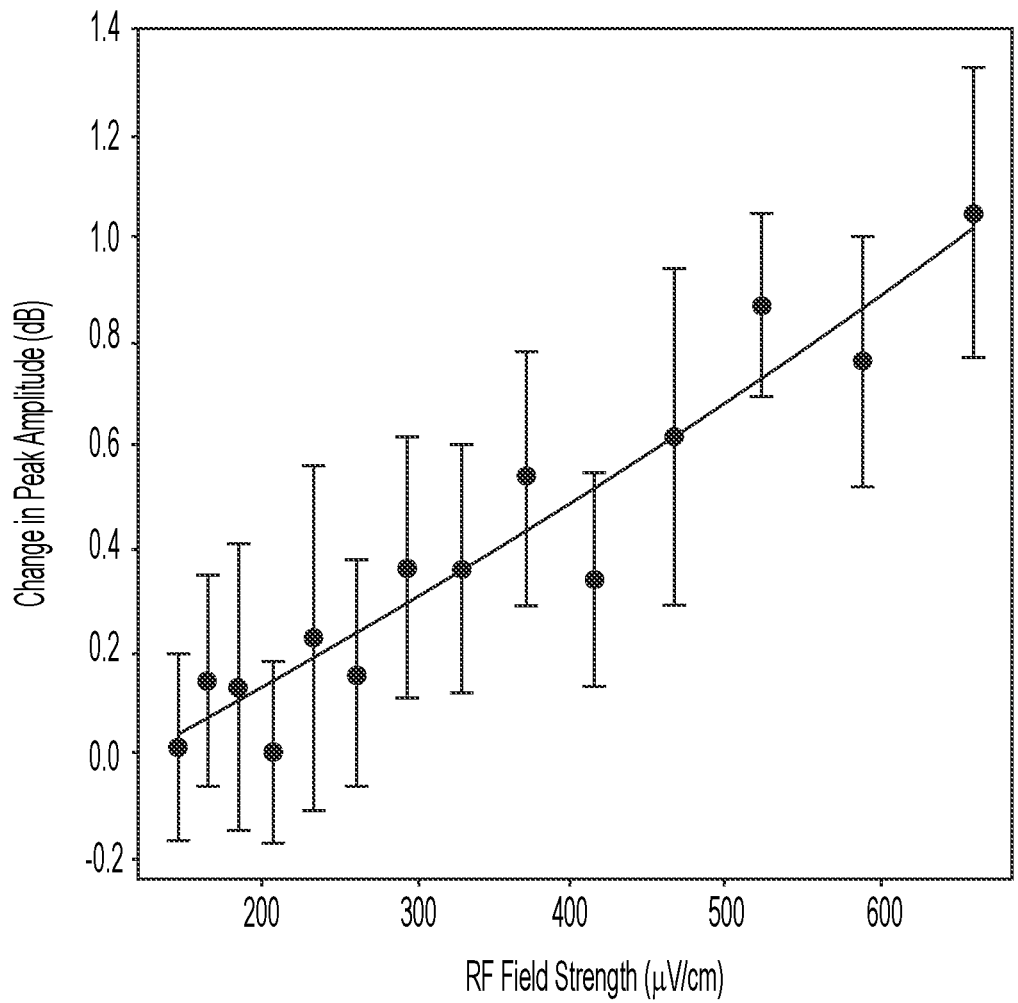
FIG. 7B is a graph showing the change in the peak amplitude differences of FIG. 7A for various magnitudes of $\sqrt{P}$ as determined using a Gaussian fit.

To determine the sensitivity limit of the system and how fast data can be obtained, the acquisition time may be reduced. The spectrum analyzer scan time may also be decreased to 1 ms, and the scan range may be decreased to 10 MHz. Five scans are then averaged for each point. The bandwidth of the spectrum analyzer is also increased to 5 kHz, thereby decreasing the signal-to-noise ratio. The sampling range to 0.1 MHz during post-processing was reduced to make the sensitivity more comparable to other results. Combined, these changes can reduce the effective scan time per measurement from 20 s to 100 µs, while still allowing for the observation of the full transmission peak. FIG. 7A shows the change induced by the RF electromagnetic field in the transmission peak amplitude obtained using these measurement settings as a function of RF electromagnetic field strength. The difference in peak amplitude is shown in FIG. 7B and this difference demonstrates a minimum detectable RF electromagnetic field strength of $234 \pm 1.2$ $\mu V$ $cm^{-1}$ and a sensitivity of $2.3 \pm 0.02$ $\mu V$ $cm^{-1}$ $Hz^{-1/2}$. The comb spectrum generated from the probe laser yields comparable sensitivity and accuracy when compared to single-frequency experiments. The recovery of the full spectral line shape can allow for small frequency fluctuations in the peak center to be observed and used to correct the measurement. Observing the full spectrum can be used to reduce noise compared to single-frequency amplitude regime measurements.

In some aspects of what is described, a system may be described by the following examples. The system may, in certain cases, be used to detect radio frequency electromagnetic radiation.

Example 1. A system comprising:
  a laser system configured to generate laser signals that comprise first and second laser signals;
  an optical comb generator configured to generate a comb spectrum based on the first laser signal, the comb spectrum comprising comb lines at respective comb frequencies;
  a vapor cell sensor containing a vapor and configured to generate an optical spectrum based on interactions of the vapor with the comb spectrum and the second laser signal, wherein:
    the optical spectrum represents, at least in part, an optical transmission of the vapor at the comb frequencies, and
    the optical spectrum comprises a property that changes in response to a radio frequency (RF) electromagnetic radiation interacting with the vapor; and
  an optical detector configured to detect the property of the optical spectrum at one or more of the comb frequencies.

Example 2. The system of example 1, wherein the property of the optical spectrum comprises an amplitude of the optical spectrum.

Example 3. The system of example 1 or example 2, wherein the property of the optical signal comprises a polarization of the optical spectrum.

Example 4. The system of example 1 or any one of examples 2-3, wherein the property of the optical signal comprises a phase of the optical spectrum.

Example 5. The system of example 1 or any one of examples 2-4, comprising a spectrum analyzer in communication with the optical detector and configured to generate data representing the property of the optical spectrum at the one or more comb frequencies.

Example 6. The system of example 5, comprising a computer in communication with the spectrum analyzer and having one or more processors and a memory, the memory storing instructions that, when executed by the one or more processors, are configured to perform operations comprising:
  determining, based on the data, an amplitude of the RF electromagnetic radiation, a polarization of the RF electromagnetic radiation, a phase of the RF electromagnetic radiation, or a combination thereof.

Example 7. The system of example 1 or any one of examples 2-6, comprising a source of the RF electromagnetic radiation configured to emit the RF electromagnetic radiation towards the vapor cell sensor.

Example 8. The system of example 7, wherein the source of the RF electromagnetic radiation comprises:
  a pulse generator and an RF generator;
  wherein the pulse generator is in communication with the RF generator and configured to generate signals representing respective pulses of the RF electromagnetic radiation; and
  wherein the RF generator is configured to generate the pulses of the RF electromagnetic radiation in response to receiving the signals.

Example 9. The system of example 1 or any one of examples 2-8, wherein the optical comb generator comprises an electro-optic modulator and an arbitrary waveform generator.

Example 10. The system of example 1 or any one of examples 2-9,
  wherein the first laser signal has a first frequency matched to a first optical electronic transition of the vapor;
  wherein the second laser signal has a second frequency matched to a second optical electronic transition of the vapor, the second optical electronic transition sharing an energy level in common with the first optical electronic transition; and
  wherein the vapor comprises an RF electronic transition configured to alter, in response to absorbing the RF electromagnetic radiation, an absorption of light by one or both the first and second optical electronic transitions.

Example 11. The system of example 1 or any one of examples 2-10, comprising:
  an acousto-optic modulator configured to split the first laser signal into first and second portions, the first portion received by the optical comb generator to generate the comb spectrum, the second portion having a frequency higher than that of the first portion.

In some aspects of what is described, a method may be described by the following examples. The method may, in certain cases, be used to detect radio frequency electromagnetic radiation.

Example 12. A method comprising:
  generating a comb spectrum in response to receiving a first laser signal at an optical comb generator, the comb spectrum comprising comb lines at respective comb frequencies;
  generating an optical spectrum by interacting the comb spectrum and a second laser signal with a vapor in a vapor cell sensor, wherein:
    the optical spectrum represents, at least in part, an optical transmission of the vapor at the comb frequencies, and
    the optical spectrum comprises a property that changes in response to a radio frequency (RF) electromagnetic radiation interacting with the vapor; and
  detecting the property of the optical spectrum at one or more of the comb frequencies.

Example 13. The method of example 12, wherein detecting the property of the optical spectrum comprises detecting the property of the optical spectrum at two or more of comb frequencies (e.g., a subset of comb frequencies, all comb frequencies, etc.).

Example 14. The method of example 13, wherein the property of the optical spectrum is detected at the two or more comb frequencies simultaneously.

Example 15. The method of example 12 or any one of examples 13-14, wherein the property of the optical spectrum comprises an amplitude of the optical spectrum.

Example 16. The method of example 12 or any one of examples 13-15, wherein the property of the optical spectrum comprises a polarization of the optical spectrum.

Example 17. The method of example 12 or any one of examples 13-16, wherein the property of the optical spectrum comprises a phase of the optical spectrum.

Example 18. The method of example 12 or any one of examples 13-17,
  wherein the method comprises receiving the RF electromagnetic radiation at the vapor cell sensor; and
  wherein generating an optical spectrum comprises interacting the RF electromagnetic radiation with the vapor in the vapor cell sensor.

Example 19. The method of example 18, wherein receiving the RF electromagnetic radiation comprises receiving pulses of the RF electromagnetic radiation at the vapor cell sensor.

Example 20. The method of example 18 or example 19, comprising:
  generating, by operation of a spectrum analyzer, data representing the property of the optical spectrum at the one or more comb frequencies; and
  determining, based on the data, an amplitude of the RF electromagnetic radiation, a polarization of the RF electromagnetic radiation, a phase of the RF electromagnetic radiation, or a combination thereof.

Example 21. The method of example 12 or any one of examples 13-20, wherein the optical comb generator comprises an electro-optic modulator and an arbitrary waveform generator.

Example 22. The method of example 12 or any one of examples 13-21, comprising:
  generating a background optical spectrum by interacting the comb spectrum with the vapor in the vapor cell sensor, the background optical spectrum representing, at least in part, a background optical transmission of the vapor at the comb frequencies; and
  detecting a property of the background optical spectrum at the one or more comb frequencies.

Example 23. The method of example 22, wherein the property of the background optical spectrum comprises an amplitude of the background optical spectrum.

Example 24. The method of example 22 or example 23, wherein the property of the background optical spectrum comprises a polarization of the background optical spectrum.

Example 25. The method of example 22 or any one of examples 23-24, wherein the property of the background optical spectrum comprises a phase of the background optical spectrum.

Example 26. The method of example 22 or any one of examples 23-25,
  wherein the method comprises:
    receiving the RF electromagnetic radiation at the vapor cell sensor,
    generating, by operation of a spectrum analyzer:
      first data representing the property of the optical spectrum at the one or more comb frequencies, and
      second data representing the property of the background optical spectrum at the one or more comb frequencies, and
    determining, based on a difference between the first and second data, an amplitude of the RF electromagnetic radiation, a polarization of the RF electromagnetic radiation, a phase of the RF electromagnetic radiation, or a combination thereof; and
  wherein generating an optical spectrum comprises interacting the RF electromagnetic radiation with the vapor in the vapor cell sensor.

Example 27. The method of example 12 or any one of examples 13-26,
  wherein the first laser signal has a first frequency matched to a first optical electronic transition of the vapor;
  wherein the second laser signal has a second frequency matched to a second optical electronic transition of the vapor, the second optical electronic transition sharing an energy level in common with the first optical electronic transition; and
  wherein the vapor comprises an RF electronic transition configured to alter, in response to absorbing the RF electromagnetic radiation, an absorption of light by one or both the first and second optical electronic transitions.

Example 28. The method of example 12 or any one of examples 13-27, comprising:
  generating, by operation of a laser system, the first and second laser signals.

Example 29. The method of example 28, wherein generating the first and second laser signals comprises locking one or both of the first and second laser signals to respective reference frequencies.

Example 30. The method of example 28 or example 29, comprising:
  splitting the first laser signal into first and second portions, the first portion received by the optical comb generator to generate the comb spectrum; and
  shifting the second portion of the first laser signal to a frequency higher than that of the first portion.

Example 31. The method of example 30,
  wherein the method comprises combining the second portion of the first laser signal with the optical spectrum from the vapor cell sensor to produce a heterodyne optical spectrum; and wherein detecting a property of the optical spectrum comprises detecting a property of the heterodyne optical spectrum at the one or more comb frequencies.

Example 32. The method of example 31, wherein the property of the heterodyne optical spectrum comprises an amplitude of the heterodyne optical spectrum.

Example 33. The method of example 31 or example 32, wherein the property of the heterodyne optical spectrum comprises a polarization of the heterodyne optical spectrum.

Example 34. The method of example 31 or any one of examples 32-33, wherein the property of the heterodyne optical spectrum comprises a phase of the heterodyne optical spectrum.

In some aspects of what is described, a method may be described by the following examples. The method may be used to detect radio frequency signals.

Example 35. A method comprising:
  receiving a radio frequency (RF) signal at a vapor cell sensor, the RF signal comprising an RF pulse;
  receiving optical signals at the vapor cell sensor, the optical signals comprising an optical comb;
  obtaining an optical spectrum based on output signals produced by the vapor cell sensor in response to the RF signal and the optical signals; and
  determining a property of the RF pulse based on a spectral line shape change of the optical spectrum.

Example 36. The method of example 35,
  wherein the optical spectrum comprises:
    an electromagnetically-induced transparency (EIT) transmission spectrum of a vapor in the vapor cell sensor, or
    an electromagnetically-induced absorption (EIA) transmission spectrum of the vapor in the vapor cell sensor; and
  wherein obtaining the optical spectrum comprises obtaining:
    a plurality of frequencies of the EIT transmission spectrum in parallel, or
    a plurality of frequencies of the EIA transmission spectrum in parallel.

Example 37. The method of example 36, wherein determining a property of the RF pulse comprises determining an amplitude of the RF pulse based on an Autler-Townes splitting of a Rydberg state energy of the vapor.

Example 38. The method of example 36 or example 37, wherein determining a property of the RF pulse comprises determining a phase of the RF pulse based on an Autler-Townes splitting of a Rydberg state energy of the vapor.

Example 39. The method of example 36 or any one of examples 37-38, wherein determining a property of the RF pulse comprises determining a polarization of the RF pulse based on an Autler-Townes splitting of a Rydberg state energy of the vapor.

Example 40. The method of example 36 or any one of examples 37-39, wherein determining a property of the RF pulse comprises determining an amplitude of the RF pulse based on a change in an amplitude of the optical spectrum.

Example 41. The method of example 36 or any one of examples 37-40, wherein determining a property of the RF pulse comprises determining a phase of the RF pulse based on a change in an amplitude of the optical spectrum.

Example 42. The method of example 36 or any one of examples 37-41, wherein determining a property of the RF pulse comprises determining a polarization of the RF pulse based on a change in an amplitude of the optical spectrum.

Example 43. The method of example 35 or any one of examples 37-42, wherein determining a property of the RF pulse comprises obtaining a self-calibrated measurement of an amplitude of the RF pulse.

Example 44. The method of example 35 or any one of examples 36-43, wherein the optical comb comprises a quasi-continuous optical comb.

Example 45. The method of example 35 or any one of examples 36-44, comprising:
  generating the optical comb from a probe laser signal; and
  obtaining the optical spectrum using self-heterodyne spectroscopy based on the output signals and the probe laser signal.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:
1. A system comprising:
  a laser system configured to generate laser signals that comprise first and second laser signals;
  an optical comb generator configured to generate a comb spectrum based on the first laser signal, the comb spectrum comprising comb lines at respective comb frequencies;
  a vapor cell sensor containing a vapor and configured to generate an optical spectrum based on interactions of the vapor with the comb spectrum and the second laser signal, wherein:
    the optical spectrum represents, at least in part, an optical transmission of the vapor at the comb frequencies, and
    the optical spectrum comprises a property that changes in response to a radio frequency (RF) electromagnetic radiation interacting with the vapor; and
  an optical detector configured to detect the property of the optical spectrum at one or more of the comb frequencies.

2. The system of claim 1, wherein the property of the optical spectrum comprises an amplitude of the optical spectrum, a polarization of the optical spectrum, or a phase of the optical spectrum.

3. The system of claim 1, comprising a spectrum analyzer in communication with the optical detector and configured to generate data representing the property of the optical spectrum at the one or more comb frequencies.

4. The system of claim 3, comprising a computer in communication with the spectrum analyzer and having one or more processors and a memory, the memory storing instructions that, when executed by the one or more processors, are configured to perform operations comprising:
   determining, based on the data, an amplitude of the RF electromagnetic radiation, a polarization of the RF electromagnetic radiation, a phase of the RF electromagnetic radiation, or a combination thereof.

5. The system of claim 1, comprising a source of the RF electromagnetic radiation configured to emit the RF electromagnetic radiation towards the vapor cell sensor.

6. The system of claim 5, wherein the source of the RF electromagnetic radiation comprises:
   a pulse generator and an RF generator;
   wherein the pulse generator is in communication with the RF generator and configured to generate signals representing respective pulses of the RF electromagnetic radiation; and
   wherein the RF generator is configured to generate the pulses of the RF electromagnetic radiation in response to receiving the signals.

7. The system of claim 1, wherein the optical comb generator comprises an electro-optic modulator and an arbitrary waveform generator.

8. The system of claim 1,
   wherein the first laser signal has a first frequency matched to a first optical electronic transition of the vapor;
   wherein the second laser signal has a second frequency matched to a second optical electronic transition of the vapor, the second optical electronic transition sharing an energy level in common with the first optical electronic transition; and
   wherein the vapor comprises an RF electronic transition configured to alter, in response to absorbing the RF electromagnetic radiation, an absorption of light by one or both the first and second optical electronic transitions.

9. The system of claim 1, comprising:
   an acousto-optic modulator configured to split the first laser signal into first and second portions, the first portion received by the optical comb generator to generate the comb spectrum, the second portion having a frequency higher than that of the first portion.

10. A method comprising:
    generating a comb spectrum in response to receiving a first laser signal at an optical comb generator, the comb spectrum comprising comb lines at respective comb frequencies;
    generating an optical spectrum by interacting the comb spectrum and a second laser signal with a vapor in a vapor cell sensor, wherein:
       the optical spectrum represents, at least in part, an optical transmission of the vapor at the comb frequencies, and
       the optical spectrum comprises a property that changes in response to a radio frequency (RF) electromagnetic radiation interacting with the vapor; and
    detecting the property of the optical spectrum at one or more of the comb frequencies.

11. The method of claim 10, wherein detecting the property of the optical spectrum comprises detecting the property of the optical spectrum at two or more of the comb frequencies.

12. The method of claim 11, wherein the property of the optical spectrum is detected at the two or more comb frequencies simultaneously.

13. The method of claim 10, wherein the property of the optical spectrum comprises an amplitude of the optical spectrum, a polarization of the optical spectrum, or a phase of the optical spectrum.

14. The method of claim 10,
    wherein the method comprises receiving the RF electromagnetic radiation at the vapor cell sensor; and
    wherein generating an optical spectrum comprises interacting the RF electromagnetic radiation with the vapor in the vapor cell sensor.

15. The method of claim 14, comprising:
    generating, by operation of a spectrum analyzer, data representing the property of the optical spectrum at the one or more comb frequencies; and
    determining, based on the data, an amplitude of the RF electromagnetic radiation, a polarization of the RF electromagnetic radiation, a phase of the RF electromagnetic radiation, or a combination thereof.

16. The method of claim 10, comprising:
    generating a background optical spectrum by interacting the comb spectrum with the vapor in the vapor cell sensor, the background optical spectrum representing, at least in part, a background optical transmission of the vapor at the comb frequencies; and
    detecting a property of the background optical spectrum at the one or more comb frequencies.

17. The method of claim 16, wherein the property of the background optical spectrum comprises an amplitude of the background optical spectrum, a polarization of the background optical spectrum, or a phase of the background optical spectrum.

18. The method of claim 16,
    wherein the method comprises:
       receiving the RF electromagnetic radiation at the vapor cell sensor,
       generating, by operation of a spectrum analyzer:
          first data representing the property of the optical spectrum at the one or more comb frequencies, and
          second data representing the property of the background optical spectrum at the one or more comb frequencies, and
       determining, based on a difference between the first and second data, an amplitude of the RF electromagnetic radiation, a polarization of the RF electromagnetic radiation, a phase of the RF electromagnetic radiation, or a combination thereof; and
    wherein generating an optical spectrum comprises interacting the RF electromagnetic radiation with the vapor in the vapor cell sensor.

19. The method of claim 10,
    wherein the first laser signal has a first frequency matched to a first optical electronic transition of the vapor;
    wherein the second laser signal has a second frequency matched to a second optical electronic transition of the vapor, the second optical electronic transition sharing an energy level in common with the first optical electronic transition; and wherein the vapor comprises an RF electronic transition configured to alter, in response to absorbing the RF electromagnetic radiation, an absorption of light by one or both the first and second optical electronic transitions.

20. The method of claim 10, comprising:
generating, by operation of a laser system, the first and second laser signals.

21. The method of claim 20, wherein generating the first and second laser signals comprises locking one or both of the first and second laser signals to respective reference frequencies.

22. The method of claim 20, comprising:
splitting the first laser signal into first and second portions, the first portion received by the optical comb generator to generate the comb spectrum; and
shifting the second portion of the first laser signal to a frequency higher than that of the first portion.

23. The method of claim 22,
wherein the method comprises combining the second portion of the first laser signal with the optical spectrum from the vapor cell sensor to produce a heterodyne optical spectrum; and
wherein detecting a property of the optical spectrum comprises detecting a property of the heterodyne optical spectrum at the one or more comb frequencies.

24. The method of claim 23, wherein the property of the heterodyne optical spectrum comprises an amplitude of the heterodyne optical spectrum, a polarization of the heterodyne optical spectrum, or a phase of the heterodyne optical spectrum.

25. A method comprising:
receiving a radio frequency (RF) signal at a vapor cell sensor, the RF signal comprising an RF pulse;
receiving optical signals at the vapor cell sensor, the optical signals comprising an optical comb;
obtaining an optical spectrum based on output signals produced by the vapor cell sensor in response to the RF signal and the optical signals; and
determining a property of the RF pulse based on a spectral line shape change of the optical spectrum.

26. The method of claim 25,
wherein the optical spectrum comprises:
an electromagnetically-induced transparency (EIT) transmission spectrum of a vapor in the vapor cell sensor, or
an electromagnetically-induced absorption (EIA) transmission spectrum of the vapor in the vapor cell sensor;
wherein obtaining the optical spectrum comprises obtaining:
a plurality of frequencies of the EIT transmission spectrum in parallel, or
a plurality of frequencies of the EIA transmission spectrum in parallel; and
wherein determining a property of the RF pulse comprises determining an amplitude of the RF pulse based on an Autler-Townes splitting of a Rydberg state energy of the vapor.

27. The method of claim 25,
wherein the optical spectrum comprises:
an electromagnetically-induced transparency (EIT) transmission spectrum of a vapor in the vapor cell sensor, or
an electromagnetically-induced absorption (EIA) transmission spectrum of the vapor in the vapor cell sensor;
wherein obtaining the optical spectrum comprises obtaining:
a plurality of frequencies of the EIT transmission spectrum in parallel, or
a plurality of frequencies of the EIA transmission spectrum in parallel; and
wherein determining a property of the RF pulse comprises determining an amplitude of the RF pulse based on a change in an amplitude of the optical spectrum.

28. The method of claim 25, wherein determining a property of the RF pulse comprises obtaining a self-calibrated measurement of the amplitude of the RF pulse.

29. The method of claim 25, wherein the optical comb comprises a quasi-continuous optical comb.

30. The method of claim 25, comprising:
generating the optical comb from a probe laser signal; and
obtaining the optical spectrum using self-heterodyne spectroscopy based on the output signals and the probe laser signal.

* * * * *

UNITED STATES PATENT AND TRADEMARK OFFICE
CERTIFICATE OF CORRECTION

| | | |
|---|---|---|
| PATENT NO. | : 11,874,311 B1 | |
| APPLICATION NO. | : 18/296307 | |
| DATED | : January 16, 2024 | |
| INVENTOR(S) | : Dixon et al. | |

It is certified that error appears in the above-identified patent and that said Letters Patent is hereby corrected as shown below:

On the Title Page

Page 2, Item (56) Column 1, Line 10 Delete "introducton" and insert -- introduction -- therefor In the Specification Column 7, Line 2 Delete "100" and insert -- 112 -- therefor Column 10, Line 7 Delete "first laser signal" and insert -- probe laser signal -- therefor Column 10, Line 10 Delete "118." and insert -- 116. -- therefor Column 10, Line 57 Delete "104a." and insert -- 104. -- therefor Signed and Sealed this
Ninth Day of April, 2024

*Katherine Kelly Vidal*

Katherine Kelly Vidal
*Director of the United States Patent and Trademark Office*